United States Patent
Dabral et al.

(10) Patent No.: US 10,756,622 B2
(45) Date of Patent: Aug. 25, 2020

(54) POWER MANAGEMENT SYSTEM SWITCHED CAPACITOR VOLTAGE REGULATOR WITH INTEGRATED PASSIVE DEVICE

(71) Applicant: Apple Inc., Cupertino, CA (US)

(72) Inventors: Sanjay Dabral, Cupertino, CA (US); David A. Secker, San Jose, CA (US); Jun Zhai, Cupertino, CA (US); Ralf M. Schmitt, San Jose, CA (US); Vidhya Ramachandran, Cupertino, CA (US); Wenjie Mao, San Jose, CA (US)

(73) Assignee: Apple Inc, Cupertino, CA (US)

( * ) Notice: Subject to any disclaimer, the term of this patent is extended or adjusted under 35 U.S.C. 154(b) by 0 days.

(21) Appl. No.: 16/231,904

(22) Filed: Dec. 24, 2018

(65) Prior Publication Data

US 2020/0204067 A1 Jun. 25, 2020

(51) Int. Cl.
*H02M 3/07* (2006.01)
*G05F 3/10* (2006.01)
*H01L 29/66* (2006.01)
*H01L 23/00* (2006.01)
*H01L 23/522* (2006.01)

(52) U.S. Cl.
CPC ............... *H02M 3/07* (2013.01); *G05F 3/10* (2013.01); *H01L 23/5223* (2013.01); *H01L 23/5227* (2013.01); *H01L 24/17* (2013.01); *H01L 29/66181* (2013.01); *H01L 2224/02379* (2013.01)

(58) Field of Classification Search
None
See application file for complete search history.

(56) References Cited

U.S. PATENT DOCUMENTS

| | | | |
|---|---|---|---|
| 9,548,288 B1 | 1/2017 | Ramachandran | |
| 9,607,680 B2 | 3/2017 | Dabral | |
| 9,748,227 B2 | 8/2017 | Zhai | |
| 2009/0045679 A1* | 2/2009 | Kuzmenka | G11C 5/147 307/48 |
| 2011/0154068 A1 | 6/2011 | Huang | |
| 2014/0035158 A1* | 2/2014 | Chang | H01L 23/481 257/774 |

(Continued)

OTHER PUBLICATIONS

Andersen, Toke M., et al., A 4.6 W/mm2 Power Density 86% Efficiency On-Chip Switched Capacitor DC-DC Converter in 32 nm SOI CMOS, Power Electronic Systems Laboratory, Proceedings of the 28th Applied Power Electronics Conference and Exposition (APEC 2013), Long Beach, CA USA, Mar. 17-21, 2013, 9 pgs.

(Continued)

*Primary Examiner* — Jeffrey A Gblende
(74) *Attorney, Agent, or Firm* — Jaffery Watson Mendonsa & Hamilton LLP

(57) ABSTRACT

Power management systems are described. In an embodiment, a power management system includes a voltage source, a circuit load located within a chip, and a switched capacitor voltage regulator (SCVR) coupled to voltage source and the circuit load to receive an input voltage from the voltage source and supply an output voltage to the circuit load. The SCVR may include circuitry located within the chip and a discrete integrated passive device (IPD) connected to the chip.

22 Claims, 21 Drawing Sheets

(56) References Cited

U.S. PATENT DOCUMENTS

2017/0317588 A1* 11/2017 Searles ................ H02M 3/158
2018/0190635 A1* 7/2018 Choi ...................... H01L 25/18

OTHER PUBLICATIONS

Lubarsky, Greg, The Forgotten Converter, Texas Instruments, Dallas, TX, Jul. 2015, 10 pgs.

Analog Devices, Inc., LTC7821 Hybrid Step-Down Synchronous Controller, www.analog.com 2017-2018, 36 pgs.

Seo, Jae-Sun, Deep Trench Capacitors for Switched Capacitor Voltage Converters, IBM T. J. Watson Research Center, 3rd Intl. Workshop for Power Supply on Chip Nov. 17, 2012, 24 pgs.

Sumida, SMD Power Inductor CDRH5D18, www.sumida.com, revised Jan. 7, 2014, 5 pgs.

Texas Instruments, LM3670 Miniture Step-Down DC-DC Converter for Ultralow Voltage Circuits, SNVS250F—Nov. 2004—Revised Feb. 2016, www.ti.com, Dallas, TX, 33 pgs.

Murata, Wire Wound Ferrite Inductor for Power Lines, https://psearch.en.murata.com/inductor/product/LQH44PN100MJ0%23.HTML, downloaded from the internet Dec. 20, 2018, 1 pg.

Alon, Elad, Fully Integrated Switched-Capacitor DC-DC Conversion, Berkeley Wireless Research Center University of California, Berkeley, 30 pgs.

Le, Hanh-Phuc, Design Techniques for Fully Integrated Switched-Capacitor Voltage Regulators, Electrical Engineering and Computer Sciences University of California Berkeley, Technical Report No. UCB/EECS-2015-21, May 1, 2015, 79 pgs.

Ng, Vincent Wai-Shan, Switched Capacitor DC-DC Converter: Superior where the Buck Converter has Dominated, Electrical Engineering and Coputer Sciences University of California Berkeley, Technical Report No. UCB/EECS-2011-94, Aug. 17, 2011, 141 pgs.

* cited by examiner

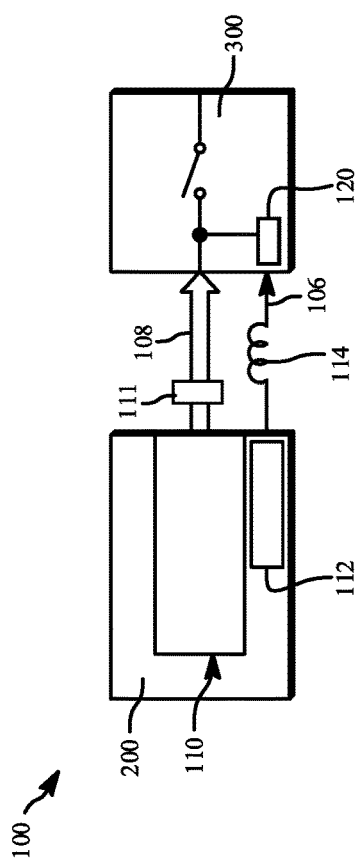
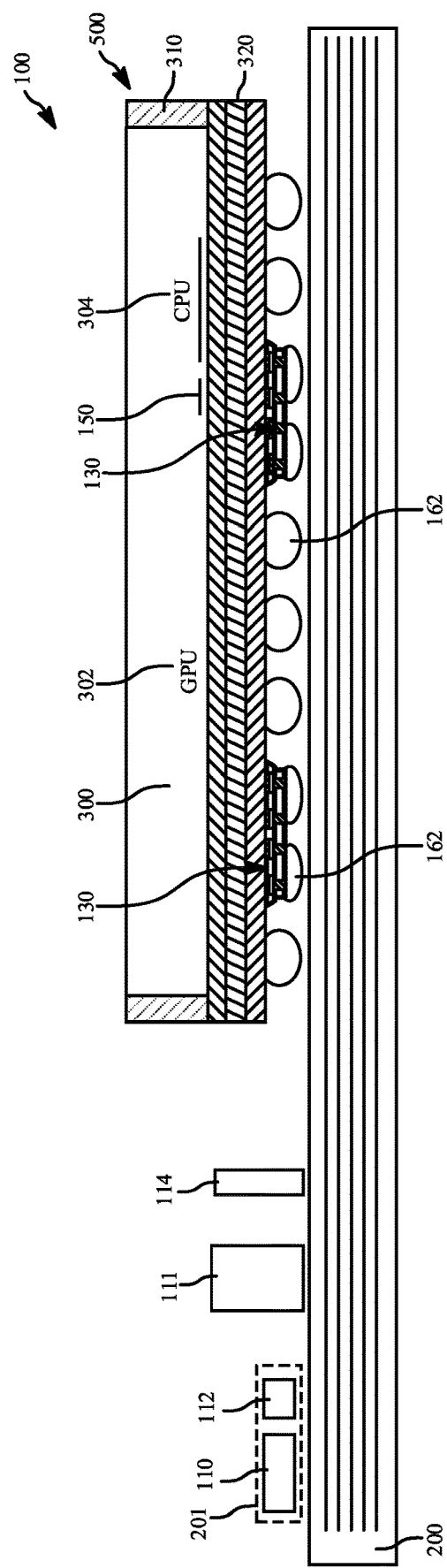
FIG. 10
FIG. 11A

POWER MANAGEMENT SYSTEM SWITCHED CAPACITOR VOLTAGE REGULATOR WITH INTEGRATED PASSIVE DEVICE

BACKGROUND

Field

Embodiments described herein relate to power management systems, and more particularly to switched capacitor voltage regulators.

Background Information

Electronic devices include various integrated circuits for performing different tasks. Often multiple integrated circuits (ICs) are integrated into a single system on chip (SOC). These ICs may additionally operate at different power supply voltage levels. Power supplies and voltage regulator circuits may be used to supply the various voltage levels for use by the ICs. For example, switched capacitor voltage regulators (SCVRs) may be implemented to provide independent voltage supplies to various circuit loads such as central processing units, graphics processing units, caches, signal I/O's, memory, etc. all on the same chip or separate chips within a system.

SUMMARY

Power management systems with switched capacitor voltage regulators (SCVRs) are described. In particular, the capacitors may be packaged separately from the circuitry of the SCVRs as discrete integrated passive devices. In an embodiment, a power management system includes a voltage source, a circuit load located within a chip, and an SCVR coupled to the voltage source and the circuit load to receive an input voltage from the voltage source and supply an output voltage to the circuit load. The SCVR can include circuitry located within the chip, and a discrete integrated passive device (IPD) connected to the chip.

The power management systems and SCVRs in accordance with embodiments may be organized a variety of configurations (e.g. low power configurations, high power configurations), each of which may additionally be designed to be operated in a number of nominal, high performance, and low performance conditions and may support multiple circuit loads.

BRIEF DESCRIPTION OF THE DRAWINGS

FIG. 10 is a schematic system level diagram of a low power application integration scheme in accordance with an embodiment.

FIG. 11A is a schematic cross-sectional side view illustration and circuit diagram of a low power integration scheme with integrated fan-out packaging in accordance with an embodiment.

DETAILED DESCRIPTION

Figure 1:
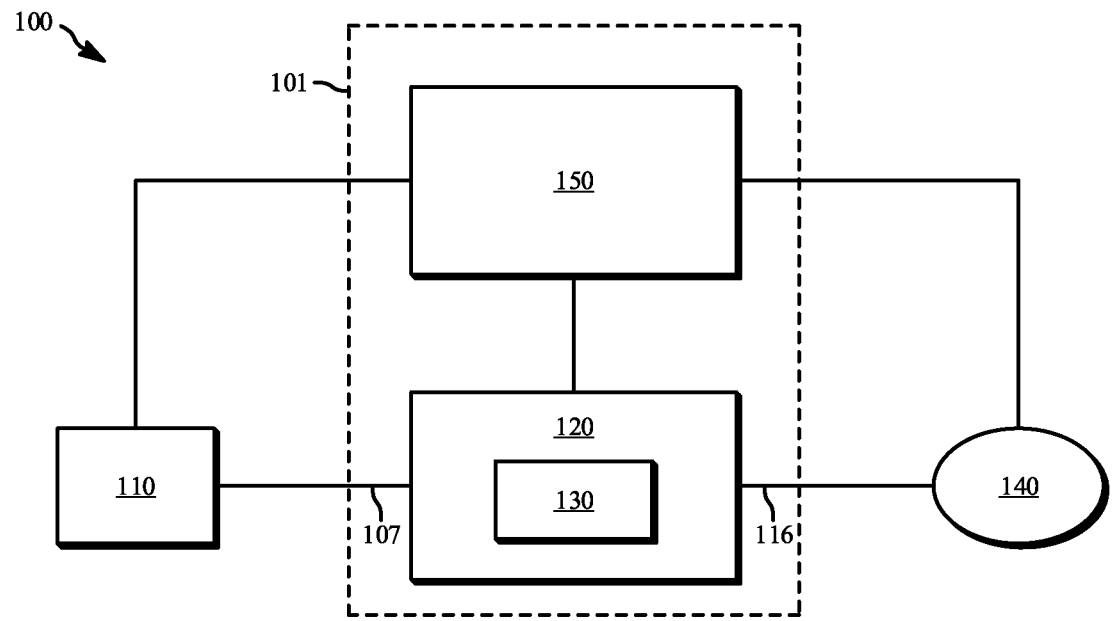
FIG. 1 is a block diagram of a power management system in accordance with an embodiment.

Embodiments describe power management systems with switched capacitor voltage regulators, in which the capacitors are packaged separately from the circuitry of the switched capacitor voltage regulators as discrete integrated passive devices. In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments. In addition, the phrase coupled to or coupled with may mean one element directly connected to another element, or connected in an electrical path than may have one or more intervening elements. The terms "over", "to", "between", and "on" as used herein may refer to a relative position of one layer with respect to other layers. One layer "over", or "on" another layer or bonded "to" or in "contact" with another layer may be directly in contact with the other layer or may have one or more intervening layers. One layer "between" layers may be directly in contact with the layers or may have one or more intervening layers.

In an embodiment, a power management system includes a voltage source (e.g. power supply), a circuit load located within a chip, and a switched capacitor voltage regulator (SCVR) coupled to the voltage source and the circuit load to receive an input voltage from the voltage source and supply an output voltage to the circuit load. The SCVR may include circuitry located within the chip, and a discrete integrated passive device (IPD) connected to the chip.

In one aspect, integration of a discrete component IPD allows the use of advanced processing nodes, or different nodes than for chip fabrication. Depending on packaging mechanism employed a high pin density can be achieved while locating the IPD close to the SCVR circuitry. Segregation of IPD increases available area since the capacitors are separate from the active SOC. This can lead to a lower power density (since larger capacitor can be realized), and increased efficiency. Additionally, since the IPD capacitors are not required to be formed in the same substrate as the active SOC, processing sequences and substrate doping is not tied to SOC logic processing. Therefore, capacitors can be fabricated to achieve a higher capacitance density, low equivalent series resistance, low series inductance, and low parasitics. Furthermore, the IPDs may be packaged using a variety of techniques such as integrated fan-out packaging, 2.5D packaging (e.g. silicon interposer), and chip on wafer (CoW) to scale the number of pins available for to support a multitude of circuit loads, phases and conversion ratio modes. Taken together any of the high capacitor density, low parasitics, number of available pins, and advanced processing technology nodes can be implemented to increase the SCVR efficiency compared to a traditional on-chip switched capacitor voltage regulator.

The power management systems and SCVRs in accordance with embodiments may be organized a variety of configurations (e.g. low power configurations, high power configurations), each of which may additionally be designed to be operated in a number of nominal, high performance, and low performance conditions and may support multiple circuit loads.

In some embodiments, the power management system maybe be configured for lower power delivery, such as in mobile systems. Such a system may include a circuit board including a main (high performance) power supply conductor connected to the main voltage source (e.g. main power supply), an auxiliary power supply conductor connected to an auxiliary voltage source (e.g. auxiliary power supply for lower performance state), and a ground conductor. The SCVR circuitry located within the chip can be coupled to the auxiliary power supply conductor and the ground conductor, and a voltage output of the SCVR circuitry located within the chip is electrically connected to the main power supply conductor and the circuit load. The power for high performance state may be delivered using the main power network, and the low performance state using the auxiliary network, both optimized for efficiency.

In an embodiment, a method of operating such a power management system can include reading a low performance state (and associated binned voltage) for a circuit load, selecting a power supply conductor rail that is coupled to a buck inductor, selecting an auxiliary conversion ratio for an SCVR coupled between the auxiliary power supply conductor rail and the circuit load, and adjusting an auxiliary voltage input value to the SCVR from the buck inductor to achieve a specified voltage output value from the SCVR to the circuit load. The power management system can also be switched to high performance state. This may include reading a high performance state (and required voltage) for the circuit load, selecting a main power supply conductor rail that is coupled to a first level voltage regulator, and adjusting an output voltage value from the first level voltage regulator to the circuit load. In some cases, the system may be configured to mitigate voltage droop when in high performance modes with large current change transients. This may include detecting a voltage droop in voltage supplied to the circuit load, drawing a compensation charge from the SCVR, and supplying the compensation charge to the circuit load to compensate the voltage droop. These methods may be a small part in overall operation of the power management system to supply a plurality of circuit loads. For example, reading the low performance state for the circuit load may be a part of reading a corresponding performance state for a plurality of circuit loads, weighted energy usage of the plurality of circuit loads, and binned voltage information for the plurality of circuit loads. As a result, a priority may be assigned to the circuit load based on the weighted energy usage of the plurality of circuit loads.

In some embodiments, the power management system maybe be configured for high power delivery, such as encountered in large systems. Such a system may include a circuit board including a main power supply conductor connected to the main voltage source (e.g. main power supply), an auxiliary power supply conductor connected to an auxiliary voltage source (e.g. auxiliary power supply), and a ground conductor. The SCVR circuitry located within the chip can include a low power circuitry and a high power circuitry, where the low power circuitry is coupled to the auxiliary power supply conductor and the ground conductor, and the high power circuitry is coupled to the main power supply conductor and the ground conductor. Voltage outputs of the low power circuitry and the high power circuitry can be electrically connected so as to provide a single voltage output rail to the circuit load to operate in high and low performance modes.

In an embodiment, a method of operating such a power management system can include reading a high performance state (and required voltage) for a circuit load, selecting a power supply conductor rail that is coupled to a first level voltage regulator, selecting a conversion ratio for an SCVR coupled between the power supply conductor rail and the circuit load, and adjusting a voltage input value to the SCVR from the first level voltage regulator to achieve a specified voltage output value from the SCVR to the circuit load. The power management system can also be switched to low performance state. This may include reading a low performance state (and required voltage) for the circuit load, selecting an auxiliary power supply conductor rail that is coupled to a buck inductor, selecting a conversion ratio for a second SCVR coupled between the auxiliary power supply conductor rail and the circuit load, and adjusting a second voltage input value to the second SCVR from the buck inductor to achieve a specified voltage output value from the second SCVR to the circuit load. These methods may be a small part in overall operation of the power management system to supply a plurality of circuit loads. For example, reading the high performance state for the circuit load can include reading a corresponding performance state for a plurality of circuit loads, weighted energy usage of the plurality of circuit loads, and binned voltage information for the plurality of circuit loads. As a result, a priority may be assigned to the circuit load based on the weighted energy usage of the plurality of circuit loads.

Referring now to FIG. 1 a block diagram of a power management system 100 is provided in accordance with an embodiment. As illustrated, the power management system 100 may include a first level voltage regulator 110 to supply one or more operating voltages. The first level voltage regulator 110 may be a component mounted on a circuit board in some embodiments. The first level voltage regulator 110 is operably connected to a power management unit (PMU) 101, which can be contained entirely within an SOC or spread out across multiple locations. The PMU 101 may include a control circuit 150 and a switched capacitor voltage regulator (SCVR) 120. The SCVR 120 in accordance with embodiments may include, a discrete integrated passive device (IPD) 130 including at least the capacitors of the SCVR 120. IPD 130 may be a low impedance IPD. In interest of clarity, in the following description and drawings the SCVR 120 circuitry including various routing and switches is commonly illustrated and described separately from the IPD 130 to show that IPD 130 may be a discrete component of the SCVR 120.

In an embodiment the SCVR 120 is located within the SOC. In accordance with embodiments, the SCVR 120 receives a voltage from voltage input 107 (Vin) and provides an output voltage from voltage output 116 to the circuit load 140. The output voltage to the circuit load is also termed the load voltage (Vload). The control circuit 150 may receive information for a specified output voltage value, and determine a necessary input voltage value to be supplied by the first level voltage regulator 110 to voltage input 107. Control circuit 150 may also use feedback control to SCVR 120, to maintain the voltage output 116 rail at desired voltage level. This determination may be further predicated on SCVR 120 efficiencies for various input voltages and available conversion ratios of the SCVR 120. The control circuit 150 may be wholly or partially located within the SOC. For example, a portion of the control circuit 150 may alternatively be located on the circuit board or package or some combination in the IPD itself. Still referring to FIG. 1, one or more SCVRs 120 are coupled to one or more circuit loads 140 contained within the SOC. The circuit loads 140 may also be connected with the control circuit 150.

Figure 2:
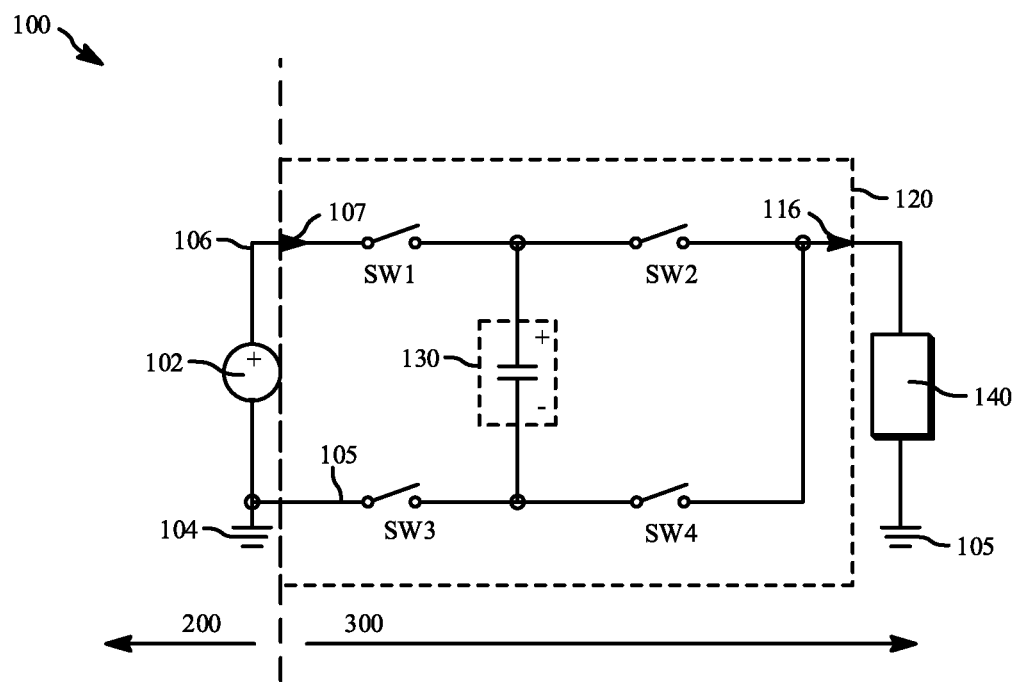
FIG. 2 is a circuit diagram of an exemplary 2:1 switched capacitor converter section of the power management system in accordance with an embodiment.

FIG. 2 is a circuit diagram of an exemplary 2:1 switched capacitor converter section of the power management system 100 in accordance with an embodiment. As shown, the circuit board 200 may include a power supply conductor 106 and a ground conductor 104 coupled to a power supply 102. A chip 300 (e.g. SOC) includes a voltage input 107 electrically connected to the power supply conductor 106 and a ground connection 105 electrically connected to the ground conductor 104. As shown, a SCVR 120 circuitry may be located within the chip 300. The SCVR 120 includes a plurality of switches Sw1, Sw2, Sw3, Sw4, that may be used to open or close a high voltage channel and low voltage channel connected to the IPD 130 in order to control the voltage output 116 applied to circuit load 140 (e.g. SOC circuit being supplied). Circuit load 140 may also be connected to ground connection 105.

Figure 3:
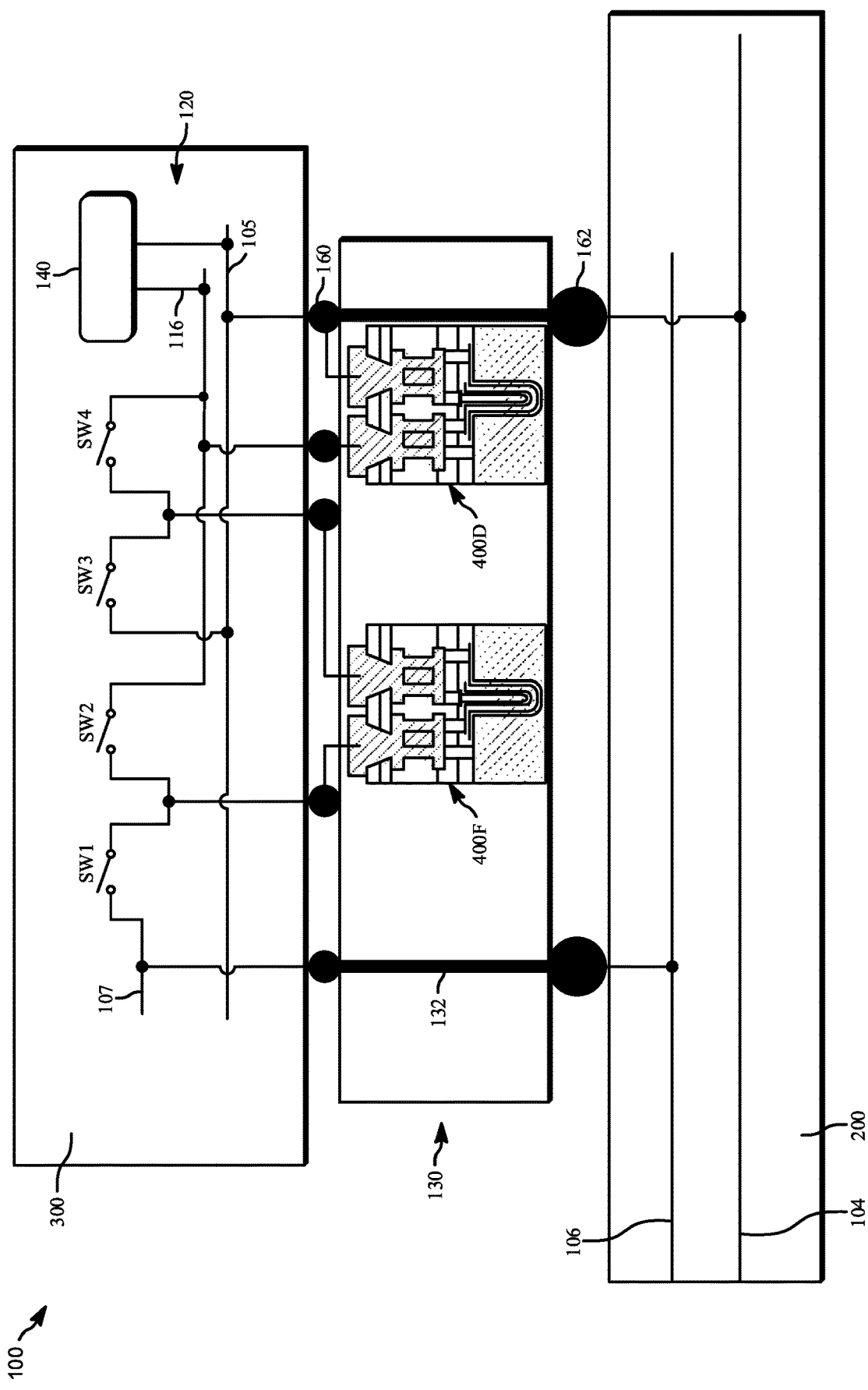
FIG. 3 is a combination schematic cross-sectional side view illustration and circuit diagram of a power management system in accordance with an embodiment.

The IPD 130 can be located on-chip or off-chip in accordance with embodiments. For example the IPD 130 may be a discrete component. FIG. 3 is a combination schematic cross-sectional side view illustration and circuit diagram of a power management system 100 in accordance with an embodiment. The illustrated circuit is substantially similar to that of FIG. 2, with location of components identified within the chip 300, IPD 130 and circuit board 200. As illustrated, the chip 300 (e.g. SOC) includes both the SCVR 120 circuitry and circuit load 140. The IPD 130 of the SCVR 120 is a discrete component. In the particular 2.5D packaging technique illustrated the IPD 130 is bonded to the chip 300 with micro bumps 160 and bonded to the circuit board 200 with ball grid array (BGA) solder bumps 162, though other packaging solutions are contemplated in accordance with embodiments. As used herein, 2.5D packaging generally includes packaging integration techniques such as silicon interposers, chip-on-wafer-on-silicon (CoWoS) and those specifically illustrated. In the particular embodiment illustrated, the IPD 130 includes a flying capacitor 400F coupled between then high voltage channel and low voltage channel, and a decoupling capacitor 400D coupled between the voltage output 116 to the circuit load 140 and ground connection 105. It is to be appreciated, the particular switched capacitor voltage regulator circuitry provided is provided for illustrational purposes only, and that embodiments are compatible with alternate switched capacitor voltage regulator circuitries.

Figure 4:
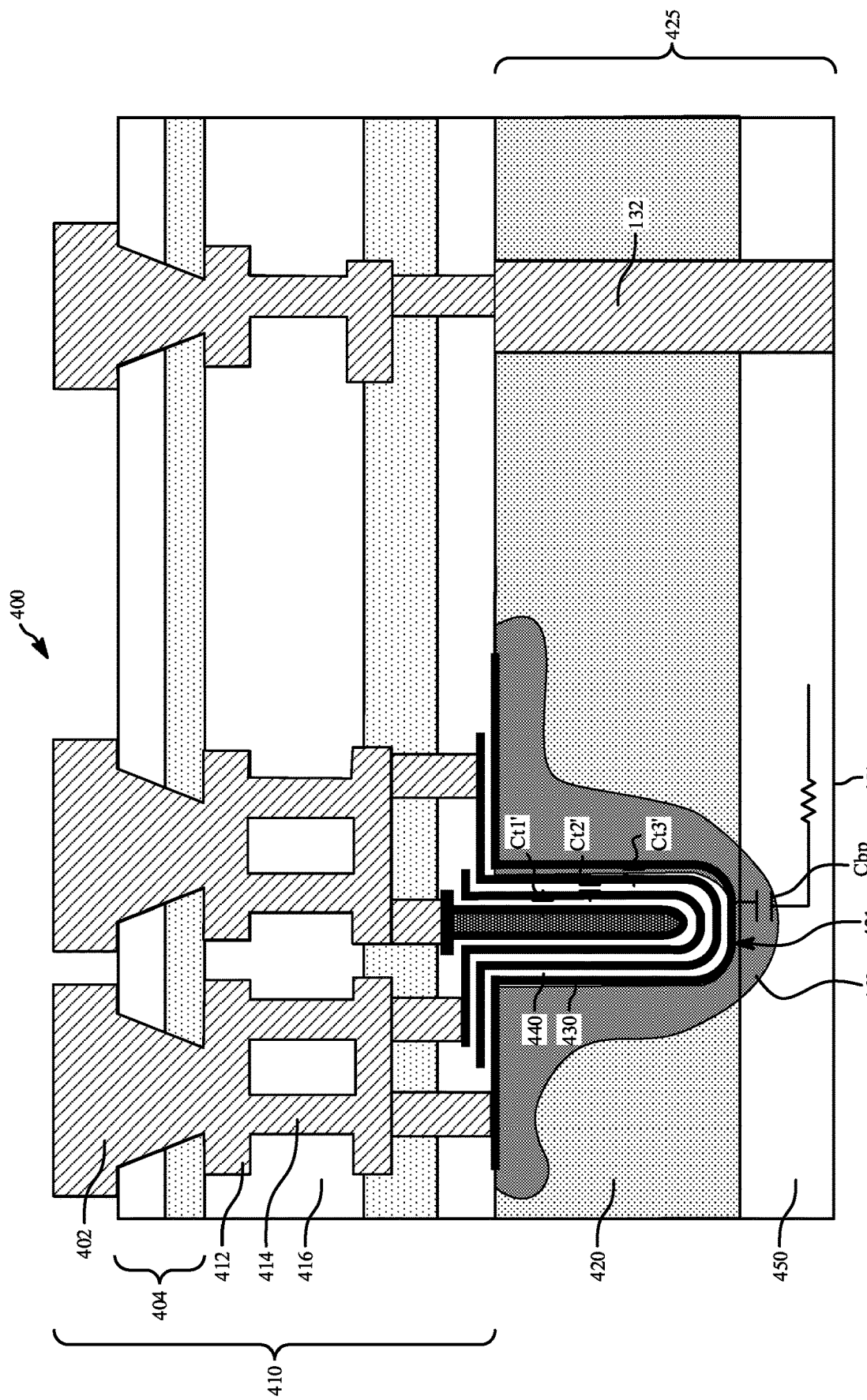
FIG. 4 is a schematic cross-sectional side view illustration of trench capacitors in accordance with an embodiment.

FIG. 4 is a schematic cross-sectional side view illustration of trench capacitors 400 in an IPD 130 in accordance with an embodiment. The capacitors 400 of IPD 130 may be trench capacitors in accordance with embodiments. The trench capacitors 400 may be fabricated using a specific targeted process with optimized capacitors, or a DRAM fabrication process, for example. In an embodiment IPD 130 includes a resistive substrate 425 (e.g. silicon substrate, or silicon-on-insulator (SOI) substrate) and buildup structure 410 over the resistive substrate 425. Resistive substrate 425 referred to herein may also be an insulating substrate. A plurality of trench capacitors 400 may be formed within the resistive substrate 425, with the buildup structure 410 including dielectric and metallization layers for interconnection. The IPD 130 in accordance with embodiments may have a low resistance path to keep efficiency high.

For example, resistive substrate 425 may be a bulk silicon substrate or SOI substrate. In the exemplary embodiment illustrated, the resistive substrate 425 includes a silicon device layer 420 and oxide layer 450. A growth substrate portion (not illustrated) may optionally exist to support the oxide layer 450. In the particular embodiment illustrated, the trench capacitors 400 include multiple, electrically separate, electrode layers 430 within a trench 421. The resistive substrate 425, or silicon device layer 420, is not required to have a high dopant concentration to keep the depletion layer capacitance small, thereby reducing parasitic. A traditional deep trench capacitor may include a highly doped substrate to lower contact resistance and serves as a bottom electrode. It has been observed this can create a parasitic back plate capacitance (Cbp) that bleeds charge and lowers SCVR efficiency. Thus, the trench capacitors 400 in accordance with embodiments may be fabricated without doping requirements of SOC active devices, or the need to use a doped substrate as an electrode. The trench capacitors 400 in accordance with embodiments may include electrode layers 430 formed of metal or other high conductivity materials. This lowers the equivalent self resistance (ESR), thereby SCVR improving efficiency. Further, metal interconnection layers like metal routing layers 412 can interconnect the capacitor cells while keeping the ESR low.

The electrode layers 430 may be separated by dielectric layers 440 (which may be high-k materials with a dielectric constant greater than silicon oxide) to form a plurality of self-capacitors (Ct1', Ct2', Ct3', etc.) in parallel. Larger capacitance lowers the effective AC impedance of the capacitor, thereby improving SCVR efficiency. This enables tuning the ratio of desirable self-capacitance (Ct) to parasitic capacitance (e.g. Cbp back plate capacitance).

Still referring to FIG. 4, the build-up structure 410 includes a plurality of dielectric layers 416 metal routing layers 412, and vias 414. Top passivation layer 404 and contact pads 402 may be provided for further packaging. In an embodiment, the resistive substrate 425, or silicon device layer 420, is characterized by a resistivity of 100-5,000 ohm·cm, or more specifically greater than 1,000 ohm·cm. The oxide layer 450, a dielectric, may have a much lower resistivity than the silicon device layer 420, which can also have the effect of increasing the depletion layer 460 distance. Thickness between a top surface of contact pad 402 to the back side 451 of resistive substrate 425 can be determined based on packaging technique. For example, a chip on wafer (CoW) packaging technique with hybrid bond attach may have a thickness of 10-20 μm. A 2.5D packaging technique with micro-bump attach may have a thickness of 20-40 μm. An integrated fan-out packaging technique with flip chip attach may have a thickness of 30-80 μm. These examples are merely illustrative, and embodiments are not limited these thicknesses. Various packaging structures are described in further detail with regard to FIGS. 5-9.

Still referring to FIG. 4, through silicon vias (TSVs) 132 may optionally be formed through the resistive substrate 425. The TSVs 132 may provide an electrical path to connect to the back side 451 of the resistive substrate 425. The TSVs 132 provide a path to the IPD 130 capacitors 400, and optionally other devices within the same silicon or other silicon die. Build-up structure 410 may additionally include interconnect routing with the TSVs 132 to contact pads 402 on the opposite side. As will become apparent in the following description, TSVs 132 may be included with all packaging structures, though they are not required. For example, a 2.5D packaging may include through mold vias in place of TSVs or in addition to TSVs.

Figure 5:
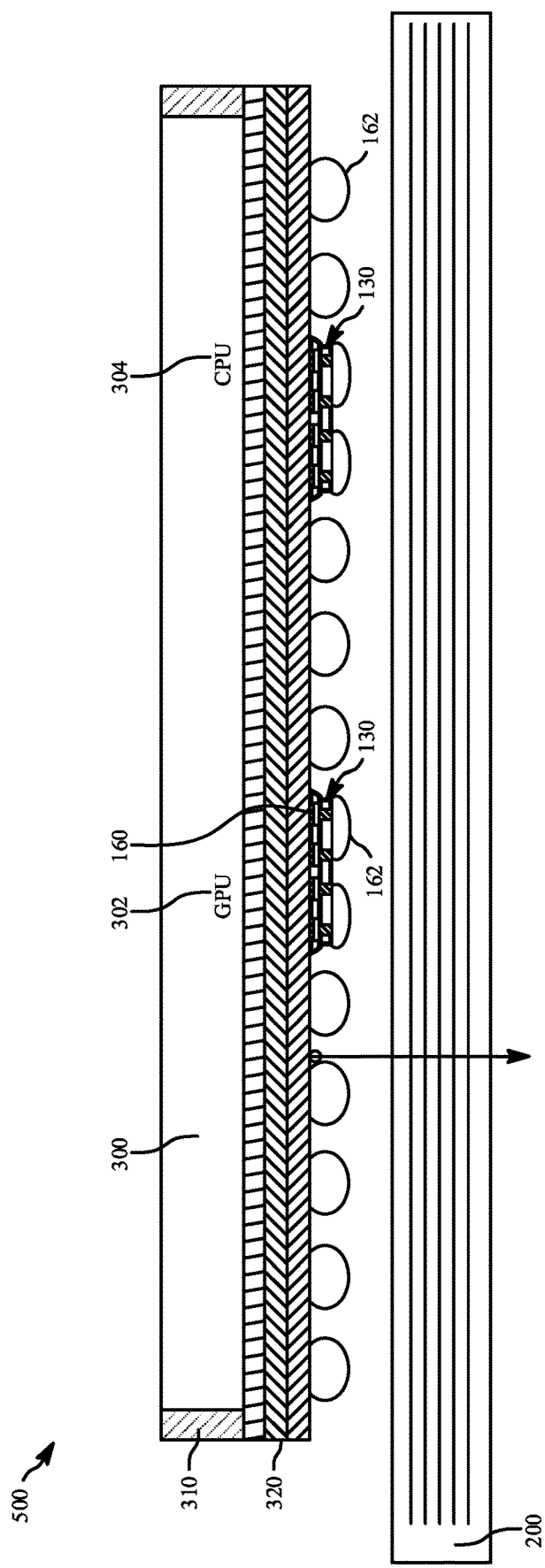
FIG. 5 is a schematic cross-sectional side view illustration of an integrated fan-out package configuration of an IPD in accordance with embodiments.

Referring now to FIG. 5, a schematic cross-sectional side view illustration is provided of an integrated fan-out package configuration of an IPD in accordance with embodiments. As shown, package 500 includes a chip 300 mounted on a redistribution layer 320 and encapsulated in a molding compound 310. Chip 300 is illustrated as an SOC, include a general processing unit (GPU) 302 core and central processing unit (CPU) 304 core. BGA solder balls 162 are provided on the opposite side of RDL 320 for mounting onto circuit board 200. In the integrated fan-out package configuration illustrated, IPD 130 is also mounted onto the opposite side of the RDL 320 laterally adjacent to the BGA solder balls 162. For example, IPD 130 is mounted using micro-bumps 160. In an embodiment, the integrated fan-out package configuration may be implemented to support a reasonable bump density, low power, and low package height. For example, bump/pin density of micro-bumps 160 may be 20-1,000/mm².

Figure 6:
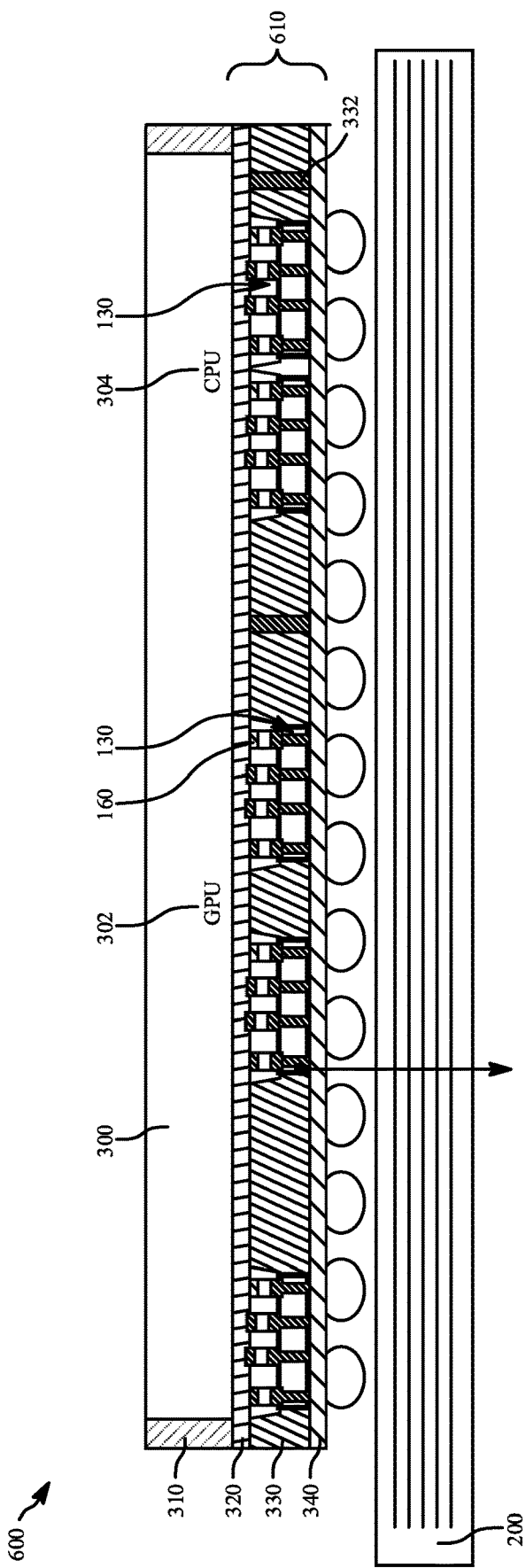
FIG. 6 is a schematic cross-sectional side view illustration of a 2.5D packaging integration the IPD in accordance with embodiments.

FIG. 6 is a schematic cross-sectional side view illustration of a 2.5D packaging integration for the IPD in accordance with embodiments. As illustrated, the package 600 includes a chip 300 mounted on a redistribution layer 320 and encapsulated in a molding compound. A plurality of IPDs 130 are mounted on the RDL 320 with a plurality of micro-bumps 160 and encapsulated within a molding compound 330. TSVs 132 may optionally be formed in the IPDs 130, and through mold vias 332 may optionally be formed through the molding compound 330 between RDL 320 and RDL 340 formed on an opposite side. The RDLs 320, 340 molding compound 330, and through mold vias 332 may form an interposer layer 610. In some embodiments, molding compound 330 can be replaced with various interposer wiring and insulator layers. A plurality of BGA solder balls 162 may be formed on RDL 340 for mounting onto circuit board 200. In an embodiment, the 2.5D packaging configuration may be implemented to support a reasonable bump density and higher power, with higher package height. For example, bump/pin density of micro-bumps 160 may be 100-1,000/mm².

Figure 7:
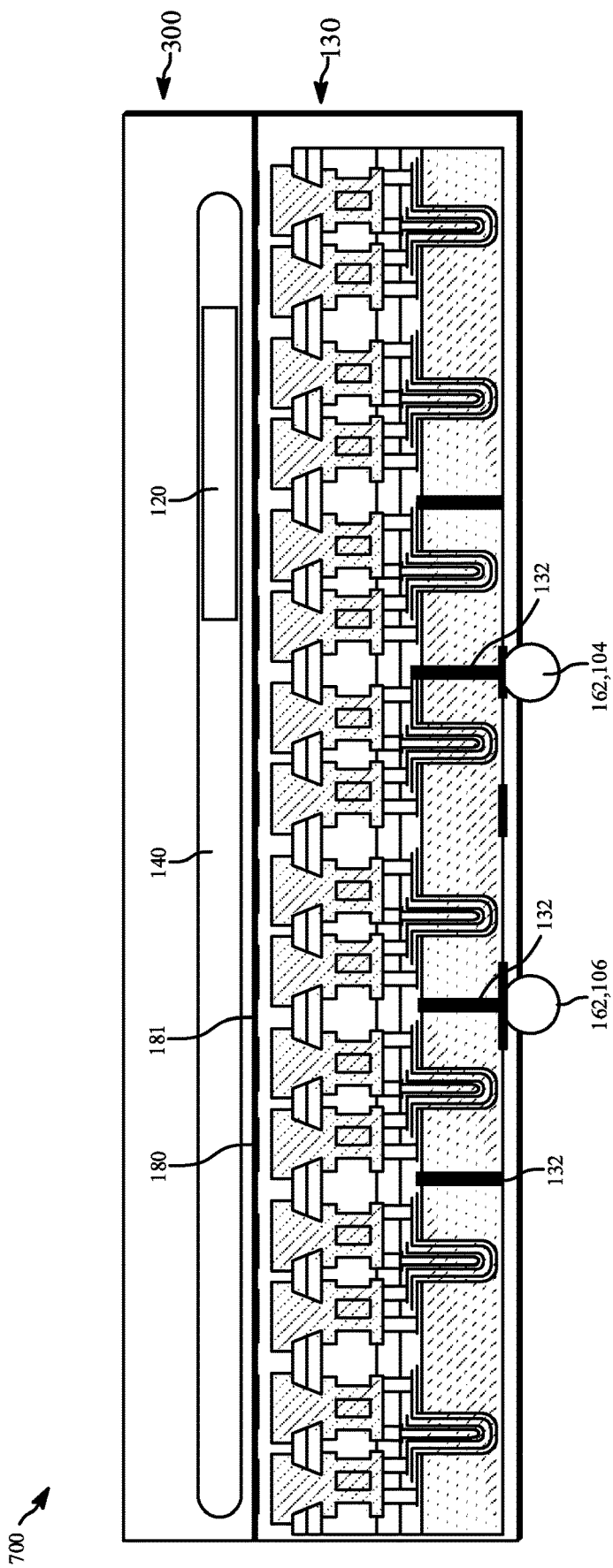
FIG. 7 is a schematic cross-sectional side view illustration of a CoW packaging integration in accordance with embodiments.
Figure 8:
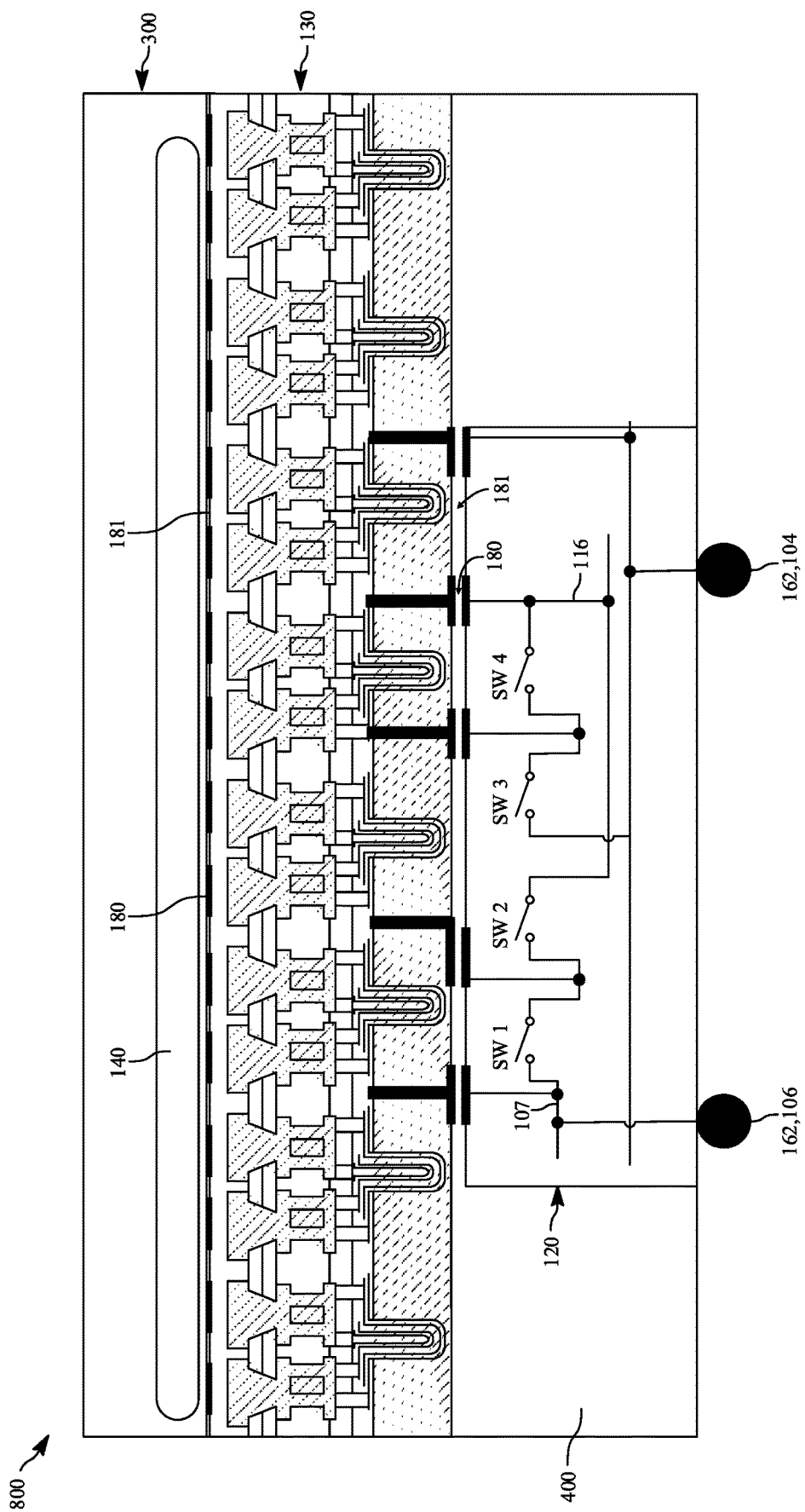
FIGS. 8-9 are combination schematic cross-sectional side view illustrations and circuit diagrams of CoW packaging integrations in accordance with embodiments.
Figure 9:
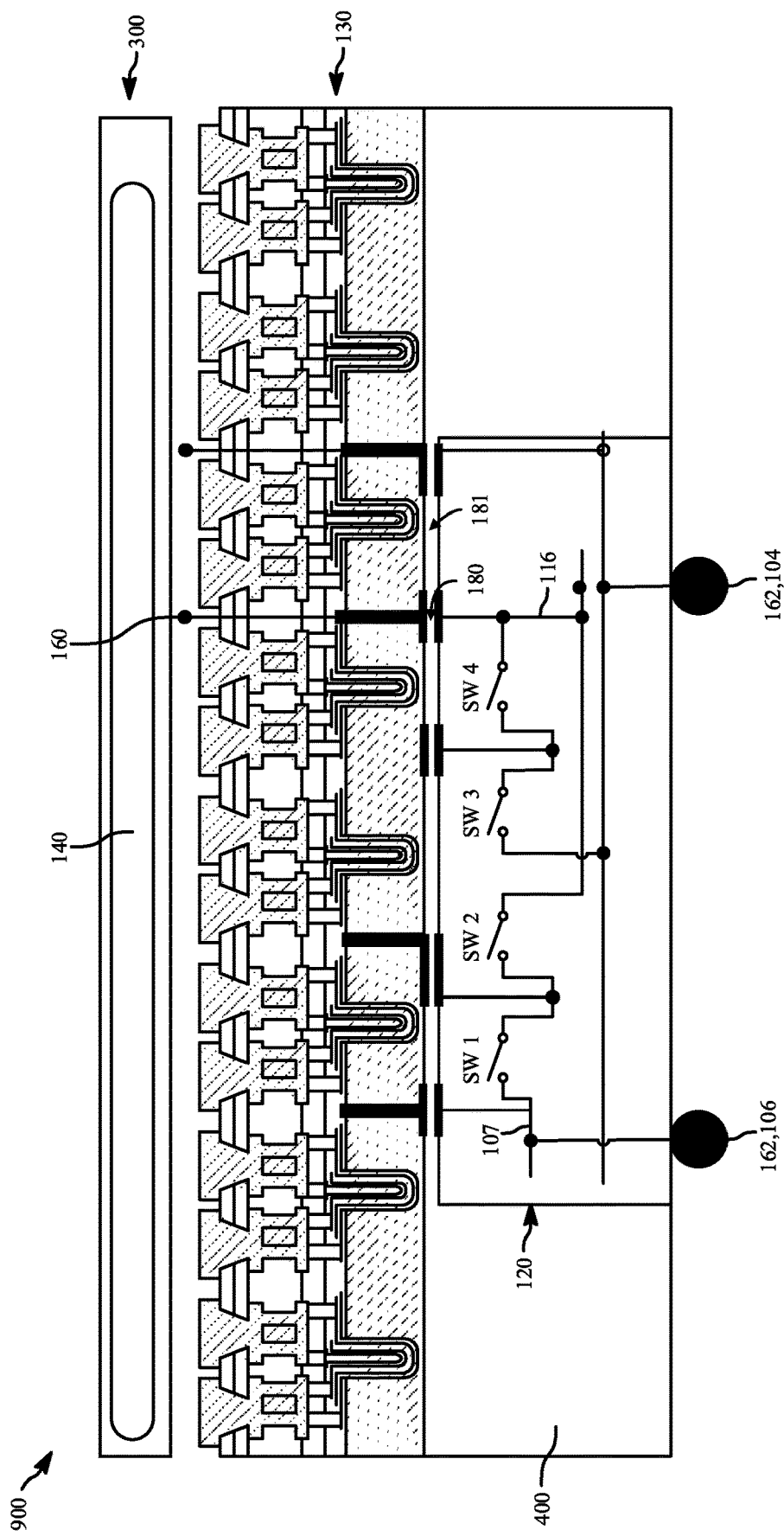

FIGS. 7-9 are schematic cross-sectional side view illustrations of various chip on wafer (CoW) packaging integration for the IPD in accordance with embodiments. The CoW packaging implementation of FIGS. 7-9 may be implemented to support a high bump density, higher power, with low package height. For example, bump/pin density of micro-bumps 160 may be 10,000-100,000/mm² due to hybrid bonding. Hybrid bonding with CoW integration may also reduce parasitics. Overall, CoW integration may enable more phases (lower ripple) and more SCVR conversion ratio modes to enable efficiency. As illustrated in FIG. 7, package 700 includes SCVR 120 circuitry located within the chip 300, and the IPD 130 is hybrid bonded to the chip 300 with metal-metal bonds 180 and oxide-oxide bonds 181. In such an embodiment, the chip 300 including both the circuit load 140 and SCVR 120 creates a second tier thickness in addition to the IPD 130 thickness. In such a CoW configuration with the SCVR 120 in chip 300, rather than having a voltage regulator and power gate as separate function, the power gate may also act as a voltage regulator switch, thereby saving some area. The last switch (e.g. Sw4) may act as the power gate to circuit to save area. Cost savings may also be realized with keeping the IPD 130 passive.

FIG. 8 illustrates a CoW integration package 800 in which the SCVR 120 to the IPD 130 is provided as a separate chip 400 which is hybrid bonded to the IPD 130 with metal-metal bonds 180 and oxide-oxide bonds 181. In this implementation package thickness includes chip 400 as first tier, and chip 300 as second tier, which can also be hybrid bonded to the IPD 130 with metal-metal bonds 180 and oxide-oxide bonds 181. In such a configuration, the chip 400 including the SCVR 120 circuitry is first attached to the IPD 130, and then that assembly is attached to the chip 300. FIG. 9 illustrates a CoW integration scheme similar to FIG. 8, with a difference being that the hybrid bonded IPD 130 and chip 400 are attached to chip 300 with micro-bumps 160 in the package 900.

In the following discussion, exemplary low power and high power integration schemes are described and illustrated. It is to be appreciated that these configurations and methods are merely exemplary, and strict partitioning into low power and high power is not necessary. Furthermore, while structural configurations may be tailored to low and high power/performance operation, the devices and circuit loads may optionally still be operated in both low performance mode and high performance mode. Accordingly, a lower power configuration is not limited to lower performance mode of operation, and a high power configuration is not limited to high performance mode of operation. Also, some SCVR implementations may not need a decoupling capacitor, or choose to allocate all IPD capacitors to the "flying" capacitors. Thus, the following implementations are to be understood as exemplary implementations of the embodiments.

Figure 11B:
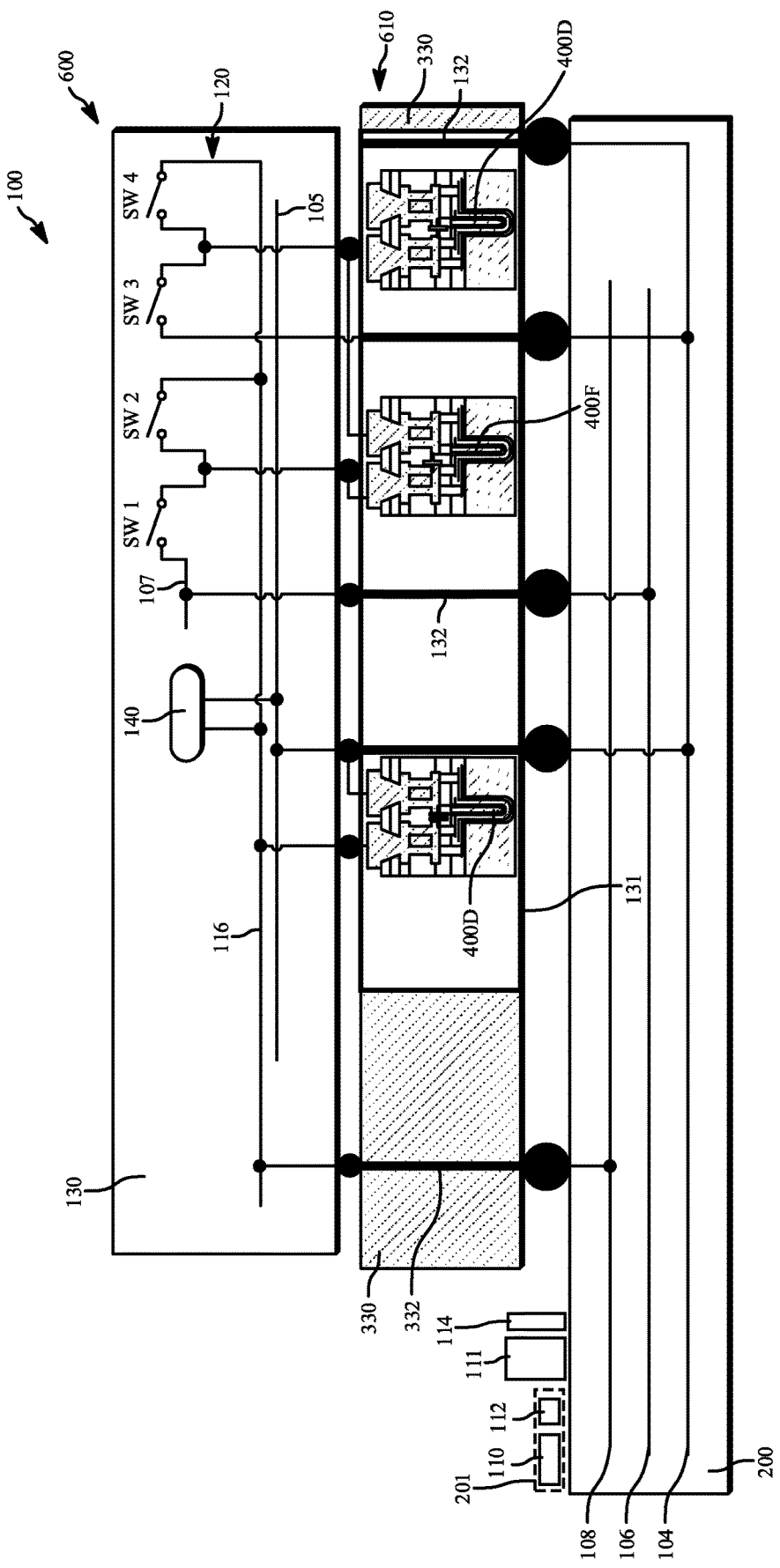
FIG. 11B is a combination schematic cross-sectional side view illustration and circuit diagram of a low power integration scheme in accordance with an embodiment.

Referring now to FIGS. 10-11B exemplary low power integration schemes of a power management system are provided in accordance with embodiments. Some features of this type of system can be any of the following: very strict height requirements, low cost package, energy conservation during extensive periods in low performance mode requiring high efficiency, energy source may usually be a battery, and component size needs to be traded off with battery volume (directly impacts energy available). Generally, these can be low power systems found in mobile applications, for example. FIG. 10 is a schematic system level diagram. FIG. 11A is a schematic cross-sectional side view illustration and circuit diagram of a low power integration scheme with integrated fan-out packaging. It is to be appreciated that integrated fan-out packaging may be one implementation for a low power integration scheme with very tight height requirements (e.g. mobile, phones, tablets), and embodiments are not so limited. FIG. 11B is a combination schematic cross-sectional side view illustration and circuit diagram in accordance with an embodiment with tight height requirements (e.g. mobile, phones, tablets). This option can also support higher power applications because of high pin density and closer integration. Notably, FIG. 11B illustrates a 2.5D packaging integration of the lower power integration scheme including outline 131 of IPD 130 encapsulated in a molding compound 330. FIGS. 10-11B show an implementation of a low power integration scheme. External regulator 201, has an input source, and produces several output rails, supporting multiple performance modes of the chip 300 SOC. External regulator 201 may include both first level voltage (buck) regulator 110 and high efficiency buck regulator 112 in one or more silicon chips, for example. High efficiency inductor 111 and high efficiency buck inductor 114 may be external passive components, for example, mounted on the circuit board 200. Using first level voltage regulator 110, and high efficiency inductor 111, main power supply is generated and connected to main power supply conductor 108 rail (for high performance). High efficiency inductor 111 may be a set of inductors supporting many phases. Using high efficiency buck regulator 112 and high efficiency buck inductor 114, auxiliary power supply is generated and connected to conductor 106 rail. SCVR 120, using auxiliary power supply conductor 106 rail as input, produces an output that is tied to voltage output 116 rail. Voltage output 116 rail supplies the circuit load 140. In addition, there may be power gates within circuit load 140, as shown in FIG. 10. While the SOC is in high performance mode (high power), main power supply conductor 108 rail provides the main power. High efficiency buck regulator 112 may be turned off in case it is not used by any other circuit. As an option, high efficiency buck regulator 112 may provide a "boost" option to reduce droop, and discussed later (FIG. 12). While chip 300 SOC is in lower performance state (lower power) mode, the (main) first level voltage regulator 110 may be turned off, if supporting no other circuits. The more efficient combination of high efficiency buck regulator 112, high efficiency buck inductor 114, and SCVR 120 is used to supply the circuit load 140.

In an embodiment, when the circuit load 140 is in high performance mode requiring high wattage and high voltage, the first level voltage regulator 110 supplies the power to the main power supply conductor 108. When the circuit load 140 is in low performance mode, requiring lower wattage and low voltage, then the high efficiency buck regulator 112 (e.g. from the auxiliary voltage source) is used to supply power to the auxiliary power supply conductor 106. The SCVR 120 converts the voltage on auxiliary power supply conductor 106 to the appropriate level required by the circuit load 140. Further in the lower performance mode, the first level voltage regulator 110 output can be tristated, or it may be turned off so that the main power supply conductor 108 is disconnected with the circuit load 140.

The SCVR 120 in accordance with embodiments may additionally provide transient droop assist in high performance states. For example, the SCVR can replace lost charge quickly, while the external first level voltage regulator 110 responds. This may reduce the AC/transient droop, thereby improving efficiency.

Figure 12A:
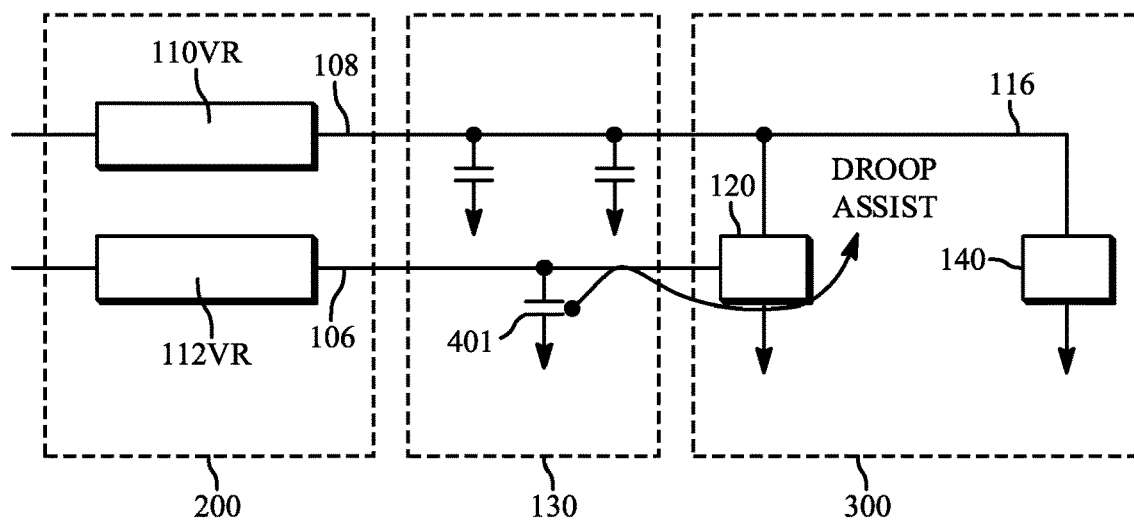
FIG. 12A is a block diagram illustrating a specific implementation of a low power integration scheme of a power management system in accordance with an embodiment.
Figure 12B:
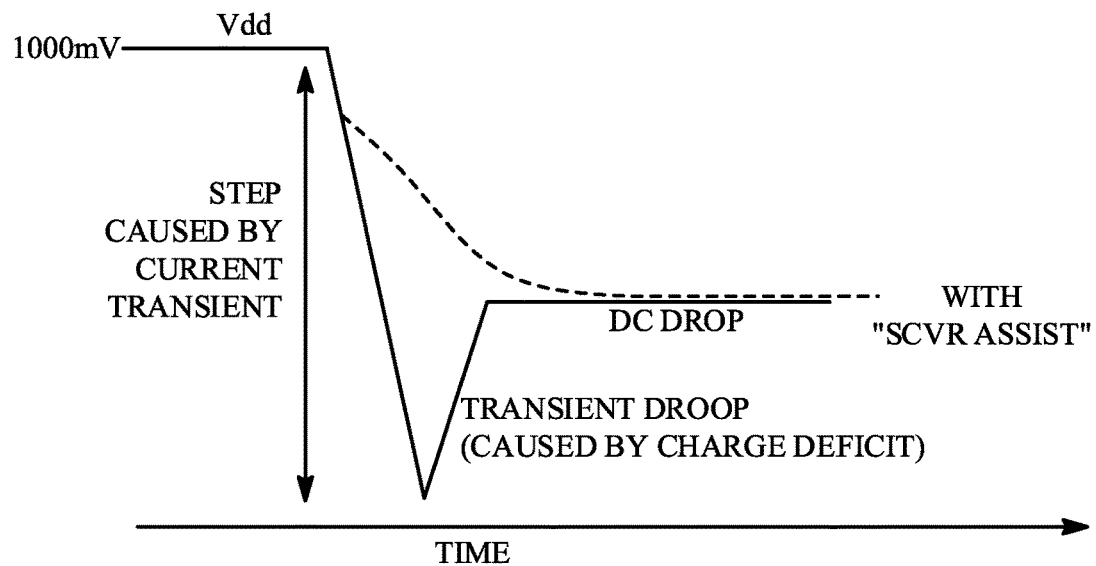
FIG. 12B is a chart illustration droop assist of the during operation of the low power integration scheme of FIG. 12A in a high performance mode in accordance with an embodiment.

Referring now to FIGS. 12A-12B, FIG. 12A is a block diagram illustrating a specific implementation of a low power integration scheme of a power management system similar to FIG. 10 operating in a high performance state, or boost case, in accordance with an embodiment, and FIG. 12B is a chart illustration droop assist of the during operation of the low power integration scheme of FIG. 12A in accordance with an embodiment. Main power supply 110VR may include either or both the first level voltage regulator 110 (e.g. silicon portion) and high efficiency inductor 111 (e.g. passive component). Auxiliary power supply 112VR may include either or both the high efficiency buck regulator 112 (e.g. silicon portion) and high efficiency buck inductor 114 (e.g. passive component). Specifically, when the low power integration scheme is operating in the high performance state (e.g. higher peak current) the SCVR 120 can act as an assist to replace lost charge quickly while the first level voltage regulator 110 responds. If there is no assist, the voltage will droop as shown in FIG. 12B. With boost in accordance with the embodiment, the voltage may droop as shown in the dashed line. The extra dip is avoided. With no assist, the dip may be compensated by raising the nominal voltage, so the minimum voltage point is above a certain required minimum point. With the assist, the nominal voltage can be reduced by the extra dip amount. Power is $V*V$ ($V$ squared) term, so it helps with power reduction.

It may be possible to provide droop assist as follows. When circuit load 140 is operating in a high performance, high voltage mode, turn on (or other low to high current draw events) transients may cause a droop in voltage output 116 rail, as shown in FIG. 12B. The SCVR can help replace this transient charge deficiency, until the first level voltage regulator 110 and power distribution network respond. Assuming the circuit load 140 needs high power voltage (Vhp) in the high performance mode, and is supplied by the main power supply conductor 108 rail, during such high performance load, the auxiliary power supply conductor 106 rail can be set at a higher voltage (n*Vhp), and the SCVR set in a n:1 mode (e.g. for n=2, power supply conductor 106 rail is at 2 Vhp, and SCVR at 2:1 mode). If the PMU detects a droop requiring assists, the PMU control triggers SCVR 120, and then it can draw charge from the power supply conductor 106 rail (now set at a higher voltage), in particular the local decoupling capacitor 401, and supply the on-chip voltage output 116 (Vload) rail connected to the load circuit 140.

In an embodiment, a method of operating a power management system with droop assist includes reading a performance state and an associated binned voltage for a circuit load 140, selecting a main power supply conductor 108 rail for the circuit load, detecting a voltage droop on voltage output 116 rail (voltage supplied to the circuit load), drawing a compensation charge from an SCVR 120 whose input is coupled to an auxiliary power supply conductor rail 106 and output is coupled to the voltage output 116 rail, and supplying the compensation charge to the circuit load 140 to compensate the voltage droop. The nominal operating voltage for the main power supply conductor 108 rail may be higher than that for the auxiliary power supply conductor 108 rail. Accordingly, the droop assist method may additionally include raising a voltage of the auxiliary power supply conductor rail 106 from an existing nominal operating voltage (possibly corresponding to another performance state) prior to supplying the compensation charge to the circuit load 140. The SCVR path (auxiliary power supply conductor rail 106 and SCVR 120) mainly supplies a transient charge in high performance mode.

Figure 13:
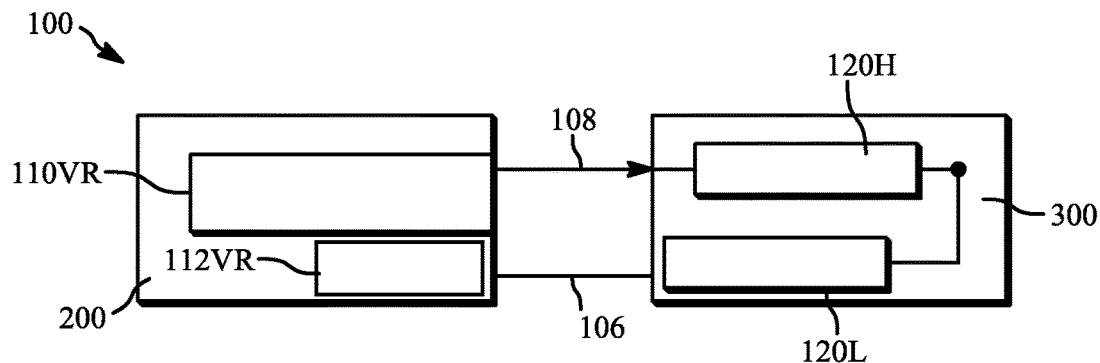
FIG. 13 is a schematic system level diagram of a high power application integration scheme in accordance with an embodiment.
Figure 14:
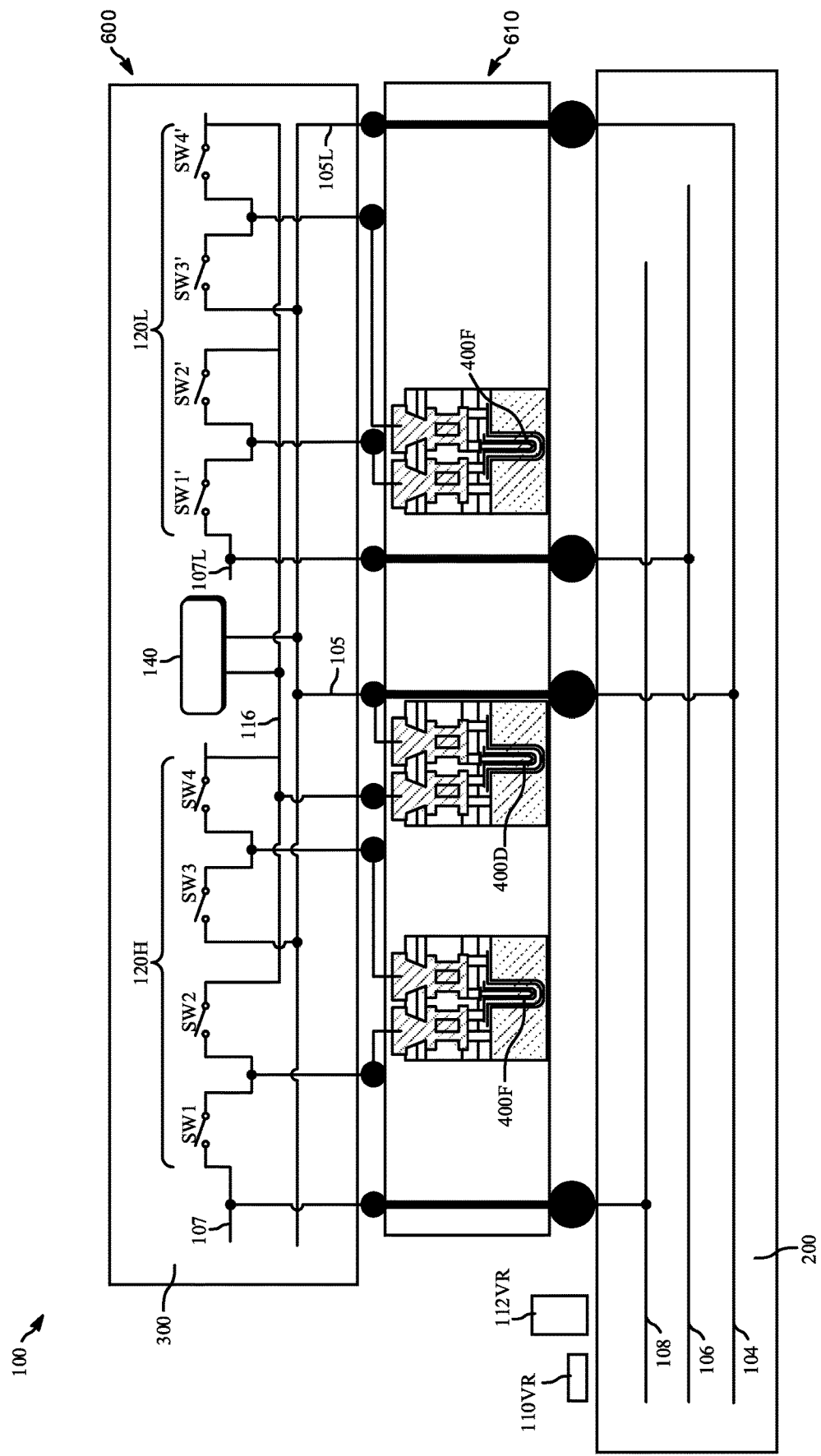
FIG. 14 is a schematic cross-sectional side view illustration and circuit diagram of a high power integration scheme with 2.5D packaging in accordance with an embodiment.
Figure 15:
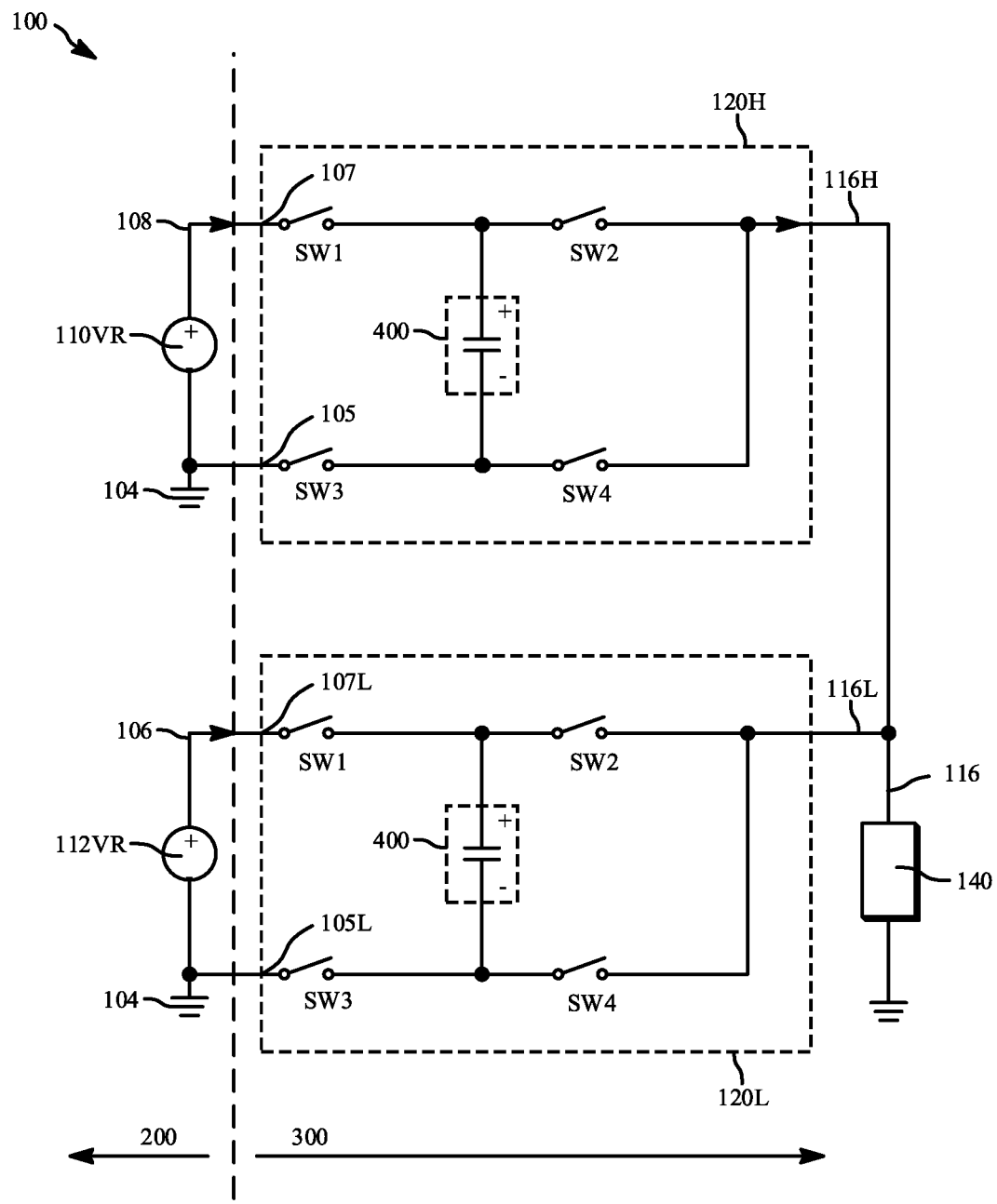
FIG. 15 is a circuit diagram of a high power integration scheme in accordance with an embodiment.

Referring now to FIGS. 13-15 exemplary high power integration schemes of a power management system are provided in accordance with embodiments. Some features of this type of system can be any of strict (but more relaxed than FIG. 10) height requirements, moderate cost package, energy conservation during extensive periods in low performance mode requiring high efficiency, energy source may not be a battery but a power supply, and more relaxed component size. Generally, these can be moderate to high power systems found in higher performance mobile, desktops or larger applications. FIG. 13 is a schematic system level diagram. FIG. 14 is a schematic cross-sectional side view illustration and circuit diagram of a high power integration scheme with 2.5D packaging. FIG. 15 is a circuit diagram. It is to be appreciated that 2.5D packaging is one implementation for a high power integration scheme, and embodiments are not so limited.

As illustrated in FIGS. 13-15, the power management system 100 may include a circuit board 200, a main power supply 110VR and auxiliary power supply 112VR for auxiliary (low) voltage supply. Main power supply 110VR may include either or both the first level voltage regulator 110 and high efficiency inductor 111. Auxiliary power supply 112VR may be buck based, or use other techniques. For example, auxiliary power supply 112VR may include either or both the high efficiency buck regulator 112 and high efficiency buck inductor 114. As shown in FIG. 14, the circuit board 200 may include a main power supply conductor 108 (for high power) and a ground conductor 104, as well as an auxiliary power supply conductor 106 (for low power). The main power supply conductor 108 in FIG. 14 supplies a high voltage to the series of switches Sw1 etc. in the SCVR 120H for high power, while the auxiliary power supply conductor 106 supplies a low voltage to the series of switches Sw1 etc. in the SCVR 120L for low power. In general, the two combinations of input voltage rails combined with corresponding SCVR to generate the required load voltage level can be extended to many voltage rails and SCVR combinations, based on system optimization.

As illustrated, the circuit board 200 may include a main power supply 110VR coupled to a main power supply conductor 108 and ground conductor 104, and auxiliary power supply 112VR coupled to an auxiliary power supply conductor 106 and the ground conductor 104. A chip 300 (e.g. SOC) includes a voltage input 107 electrically connected to the main power supply conductor 106 and a ground connection 105 electrically connected to the ground conductor 104. Chip 300 additionally includes an auxiliary voltage input 107L electrically connected to the auxiliary power supply conductor 106 and a ground connection 105L electrically connected to the ground conductor 104.

SCVR 120H is coupled to the main power supply conductor 108, ground connection 105 and voltage output (Vload) 116H to provide high power to the common circuit load 140. SCVR 120L is coupled to the auxiliary power supply conductor 106, ground connection 105L and voltage output (Vload) 116L to provide low power to the common circuit load 140. As illustrated, voltage outputs 116H, 116L are electrically connected and engaged so as to provide a single voltage output 116 rail to the common circuit load 140 to operate in high and low performance modes.

A configuration such as those in FIGS. 13-15 may be applicable to many load scenarios (e.g. FIG. 23A-23B), or a case may loads want a large range of voltages (extremely low, to maximum). Here the "small" power load (PL) may be larger because many circuit blocks may be supplied (see FIG. 16 for example), thereby making the load larger (PL">PL). Here the buck efficiency may not be as low as the extreme small mobile form factor cases. The buck inductor 114 (associated with the auxiliary power supply 112VR) size may be larger (lower resistance). In a way, even the high power configuration is now using the low power configuration technique; increase the voltage at the buck source, reduce the current, reduce the buck loss and board package IR loss, and then convert to a desired voltage at destination using the SCVR.

In an embodiment, when the circuit load 140 is in the high performance mode requiring high wattage and high voltage, the main power supply 110VR is used. The SCVR 120H is used to convert the high voltage on main power supply conductor 108 rail to the appropriate level for the circuit load 140. The voltage and SCVR mode are coordinated to provide a high efficiency operation point. Similarly, when the circuit load 140 is in lower performance mode, low wattage and low voltage are required. In this case the auxiliary power supply 112VR is used. SCVR 120L is used to convert higher voltage on the auxiliary power supply conductor 106 rail to an appropriate load required voltage. The input voltage level and SCVR mode are coordinated to provide a high efficiency operation point. The main power supply 110VR and auxiliary power supply 112VR shown can both optimize efficiency to their power levels. Also it may be possible in a general case than many loads are being serviced, each in their own performance state, and the main power supply 110VR and auxiliary power supply 112VR may be required to ensure high performance and low performance voltages are available.

In the foregoing discussion, the configurations illustrated included at least two power supply conductor rails including auxiliary power supply conductor 106 (for low power), and main power supply conductor 108 (for high power). These cover the case where one circuit load can be in high performance mode (e.g. needing high watts/current, and high voltage) and needs to have high efficiency voltage regulator. These also cover the case where one circuit load can be in low performance mode (e.g. needing low current, usually for extensive time, and high efficiency). The PMU has the choice of selecting between the rails to get the highest efficiency point.

Figure 16:
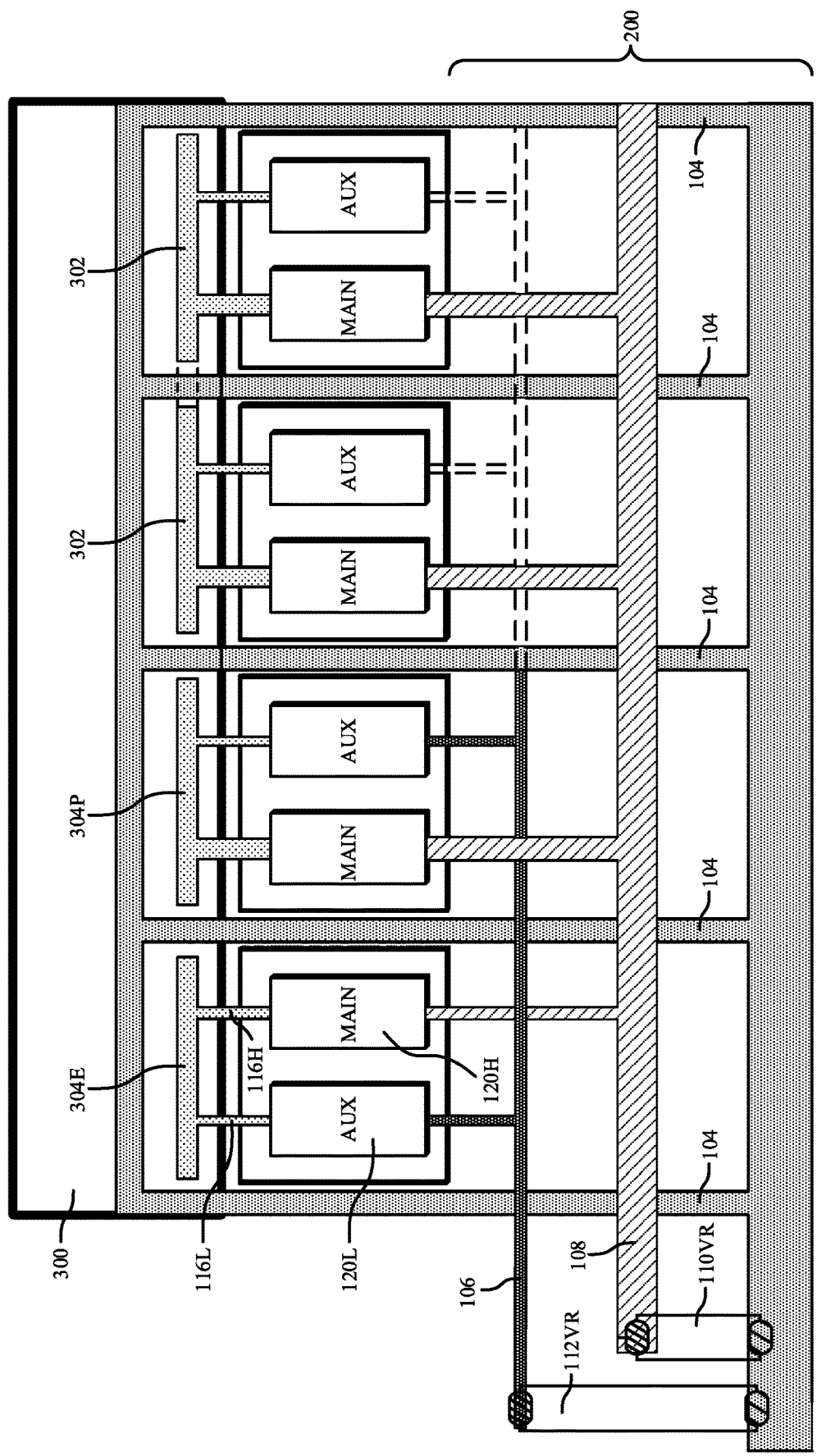
FIG. 16 is a block diagram illustrating an implementation of a high power integration scheme in accordance with an embodiment.

FIG. 16 is a block diagram illustrating an implementation of a high power integration scheme of a power management system in accordance with an embodiment. As shown, the chip 300 may include various circuit loads including a general processing unit (GPU) 302 circuit load 140, efficient central processing unit (ECPU) 304E circuit load 140, and performance central processing unit (PCPU) 304P circuit load 140. The circuit board 200 includes a main power supply conductor 108 (for high power), a ground conductor 104, and an auxiliary power supply conductor 106 (for low power). A main power supply 110VR may also be on the circuit board 200, and coupled with the main power supply conductor 108 (for high power) and ground conductor 104 in order to adjust power supplied to the main power supply conductor 108. An auxiliary power supply 112VR may be similarly located and coupled with the auxiliary power supply conductor 106. In the embodiment illustrated, both a respective SCVR 120H for high power and SCVR 120L for low power can be coupled to each circuit load (e.g. 302, 304E, 304P) to supply a main (high power) or auxiliary power (low power). In the exemplary implementation illustrated, the auxiliary power supply conductor 106, and SCVR 120L are optionally not connected for some circuit loads (e.g. for GPU 302), with optional connections illustrated by dashed lines. Likewise, depending on circuit requirements, the main power supply conductor rail and SCVR (120H) may be skipped. Further it should be noted that the SCVR 120L and 120H are sized to provide appropriate power to individual circuit blocks i.e. they will likely be different.

Still referring to the system illustrated in FIG. 16 the embodiment includes at least two power supplies (main power supply 110VR and auxiliary power supply 112VR) and corresponding rails, and many more loads (302, 304E, 304P, etc.) each of which may be on/off independently. The number of operation variables includes each load circuit in each performance state (high, low, off). To meet these demands the PMU can select the appropriate SCVR mode and voltage supply (selection of main power supply conductor 108 rail or auxiliary power supply conductor 106L rail). Selection of voltage supply can be changed for a global optimum at the performance state, and may change over time. Methods of operation illustrated and described below with regard to FIGS. 18 and 21 may be utilized for a global optimization in accordance with embodiments. This is graphically illustrated in FIGS. 19A-19C, 20A-20C, 22A-22B, 23A-23B. Specifically, FIGS. 19A-19C illustrated one implementation with a single external voltage regulator, two SCVRs, and two circuit loads. FIGS. 22A-23B illustrate one implementation with a single external voltage regulator, two or more SCVRs, and two or more circuit loads. In either implementation, it is understood a second voltage regulator may also be present and used for other performance modes (e.g. low or high).

Figure 17:
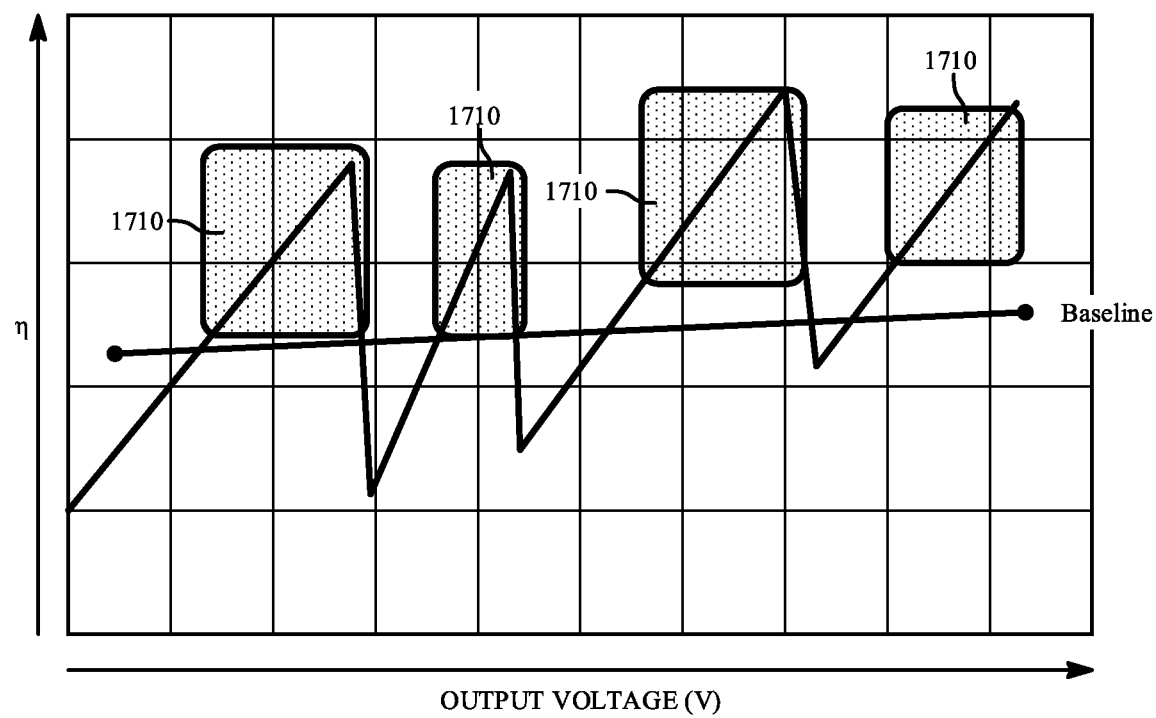
FIG. 17 is a generalized simulation plot of SCVR output voltage efficiency over output voltage range for different conversion ratios at a single input voltage in accordance with embodiments.

FIG. 17 is a generalized typical plot of SCVR output voltage efficiency over output voltage range for different conversion ratios at a single input voltage in accordance with embodiments. Also shown is a relative comparison with a buck-style regulator, whose efficiency is relatively stable over the output voltage (shown as baseline). As shown, the SCVRs in accordance with embodiments may operate more efficiently at discrete voltage levels set at ratios between voltage input 107 (Vin) values and voltage output 116 (Vload) values. Corresponding to these modes, there is a resulting "saw-tooth" efficiency curve. As described in further detail below, high residency state ranges 1710 can be identified for each conversion ratio mode of operation above a nominal baseline value. Such high residency state ranges 1710 may be correlated with being in an acceptable operational range for the circuit load, particularly when accommodating multiple loads or operating conditions of the circuit load, such as high power operational mode or power saving mode. Operating in regions 1710 can save net energy, while efficiency going below a baseline would result in a poor tradeoff. It is to be appreciated that the specific modes illustrated are exemplary, and actual implementations may vary.

Selection of the SCVR operating conditions can be made at the initial design and manufacturing stages of the power management system in accordance with embodiments.

Figure 18:
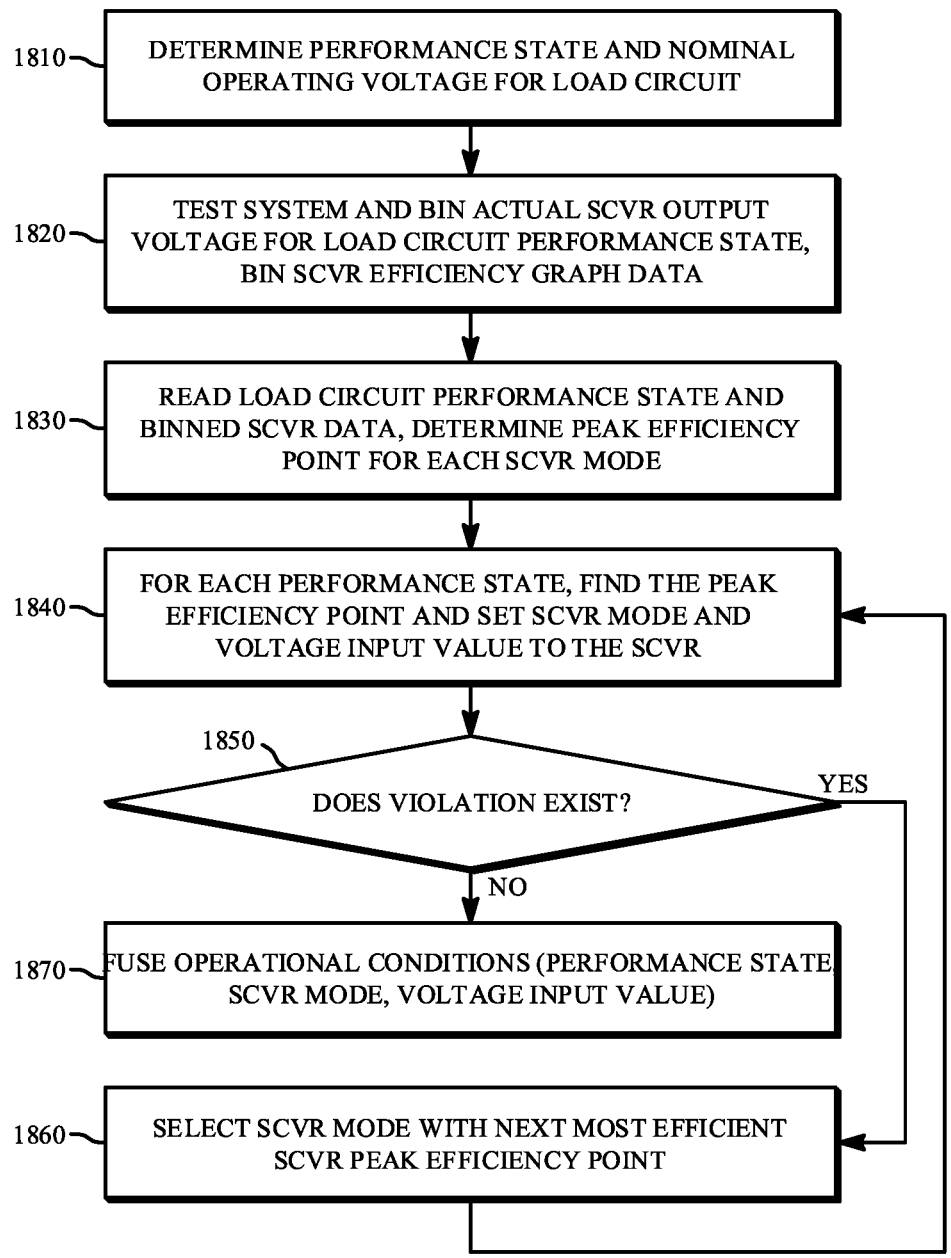
FIG. 18 is a flow chart of a method of fabricating a power management system including a single power supply and single circuit load in accordance with an embodiment.
Figure 19A:
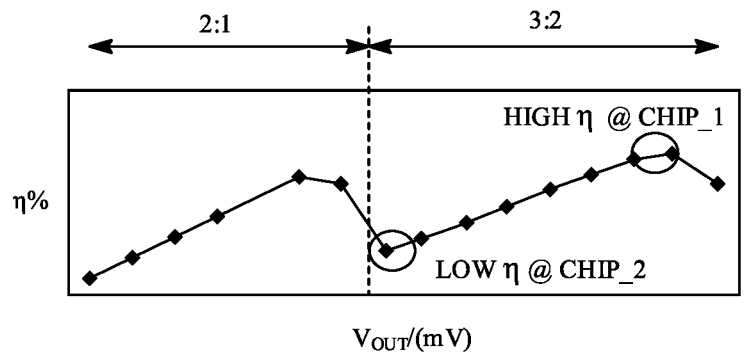
FIGS. 19A-19C illustrate overlapping efficiency plots for exemplary power management systems in accordance with embodiments, each including a single power supply and single circuit load operated in accordance with the sequence illustrated in FIG. 18.
Figure 19B:
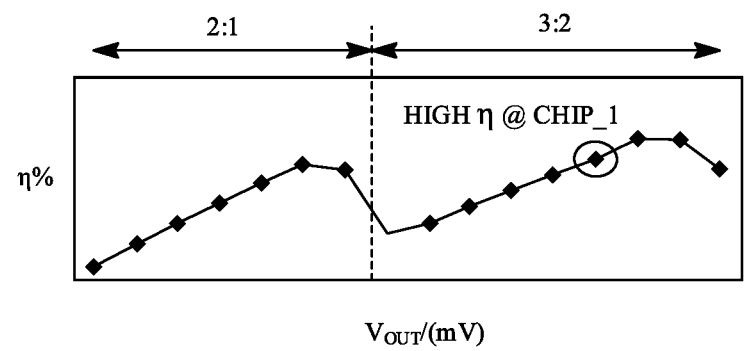
Figure 19C:
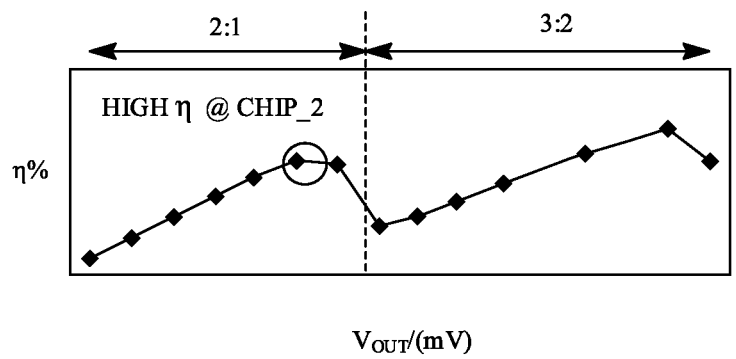

Referring now to FIG. 18 a flow chart is provided of a method of fabricating a power management system including a single power supply and single circuit load in accordance with an embodiment. Thus, this may be a single load, single external voltage regulator, single SCVR case. Block 1810 is directed to the initial architecture and design phase for the system, where performance states (e.g. high power or low power, for example associate with high frequency or low frequency operation) of the circuit loads and nominal SCVR 120 voltage output 107 values to the circuit loads are determined. Block 1820 is directed to the initial manufacturing and test binning phase for the system in which, for each performance state, SCVR 120 data is tested and binned. This may include actual SCVR 120 voltage output 116 values, and SCVR 120 efficiency graph data over a range of output voltages (e.g. such as data presented in FIG. 17), and for a range of voltage input 107 values.

The manufacturing sequence continues in blocks 1830-1870. At block 1830 a test circuit may be used to read the circuit load performance state and binned voltage information, which may be stored in a lookup table within control 150, and determine a peak efficiency point for each SCVR 120 conversion ratio mode. At block 1840, for each circuit load performance state, based on the referenced lookup table information, the SCVR 120 conversion ratio mode and first level voltage regulator 110 voltage output value, which corresponds to the SCVR 120 voltage input 107 (Vin), are selected. At block 1850 the selected first level voltage regulator 110 voltage output value is inspected to determine whether the selected value is within expectations and safe limits. If the values are within the prescribed ranges, then the information (performance state, SCVR mode, and first level voltage regulator output voltage) are fused to control 150 at block 1870. If a violation exists, then at block 1860 the next most efficient SCVR mode is selected, and block 1840 is repeated to select the associated first level voltage regulator 110 output voltage value. The final fused values are sufficient, optimized and compatible with the PMU firmware to set required binned voltage, switched capacitor modes, and external voltage regulator modes for each required state.

Referring now to FIGS. 19A-19C reference is made to efficiency plots for typical SCVRs in accordance with embodiments to illustrate design and testing for the manufacturing sequence of power management system with a single power supply and single circuit load in accordance with the sequence illustrated in FIG. 18. In the embodiment of FIG. 19A, the single input voltage (voltage input 107) is constrained to a once selectable input level for the rail. It is demonstrated that using the SCVR switching modes that one can optimize the efficiency for this chip ensemble. In FIG. 19A, an efficiency plot corresponding to operation 1820 is provided for multiple chips 300 in a single power supply and single circuit load. For example, chip 1 and chip 2 may be the same chip design with different binning due to manufacturing, or have been assembled in different manufacturing and assembly processes. The efficiency plot of FIG. 19A illustrates that for the same SCVR 120 voltage input 107 value, that the actual SCVR 120 voltage output 116 values are different, and that chip 1 is operating at a higher efficiency that chip 2 does with the same voltage input 107 value. Thus, this suggest that the required SCVR 120 voltage output 116 values to the chips (i.e. circuit loads) required to operate at a nominal chip frequency may be different. The nominal chip design voltage may be 1000 mV for a performance state (1V is normalized voltage for illustration). After manufacturing one chip, chip 1 may require a binned value of approximately 1100 mV, while another chip, chip 2, may require a binned value of 925 mV. FIG. 19B shows the efficiency improvement for chip 1. Here a SCVR operation mode of 3:2 is selected, with an input voltage of approximately 1850 mV to obtain the required 1100 mV. For chip 2, a SCVR 2:1 mode is selected with the same input voltage of approximately 1850 mV to obtain 925 mV. Both resulting voltage points are serviced at a higher efficiency. Thus, FIGS. 19A-19C illustrate application of the design and test fabrication sequence illustrated in FIG. 18 to two types of systems. For example, the one board voltage source rail (connected to voltage input 107) may be servicing two different chips on the same circuit board with each chip requiring different binned voltage levels, or two different chips (each requiring different voltage) on different circuit boards, but with board rail (connected to voltage input 107) is a once selectable level for all the boards. It is to be appreciated that while this description shows the case where one can tune the SCVR mode to get better efficiency points this is only one variable. Another variable includes changing the input voltage itself. Between the two variables, overall better efficiency points can be obtained for multiple SCVR/load configurations.

Figure 20A:
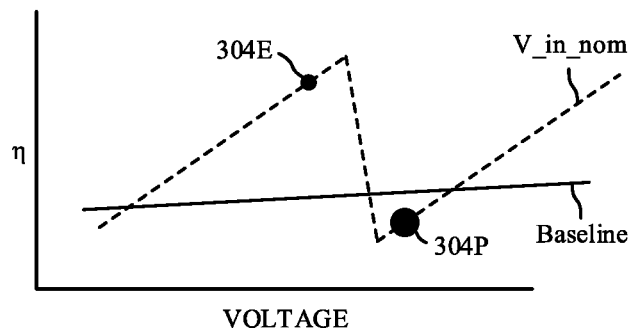
FIG. 20A illustrates an SCVR efficiency plot for two circuit loads connected to a single voltage input in accordance with an embodiment.
Figure 20B:
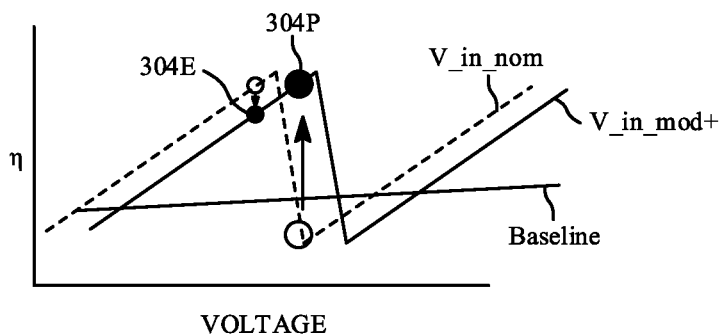
FIG. 20B illustrates an SCVR efficiency plot in which there is a relatively small voltage ratio between the two circuit loads in accordance with an embodiment.
Figure 20C:
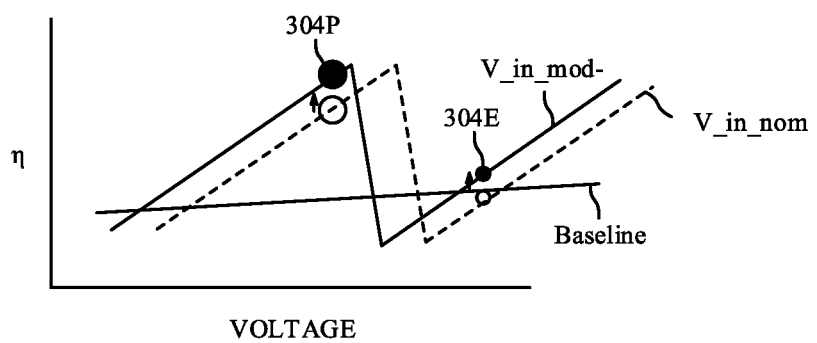
FIG. 20C illustrates an SCVR efficiency plot in which there is a relatively large voltage ratio between the two circuit loads in accordance with an embodiment.

FIGS. 20A-20C illustrate exemplary applications of a power management system in accordance with embodiments. Often a PMU will need to deliver power to multiple circuit blocks (e.g. CPU/GPU; or core(s) of a CPU, or a high performance CPU (PCPU) and an efficient CPU (ECPU); or GPU core(s) or other equivalents). Each of these circuit blocks may operate at its own target voltage corresponding to a performance state (e.g. PCPU may be set at 1 V, and ECPU at 0.85 V. The voltage should be read as normalized unit to illustrate the point). Further, there is a net distribution of "binned" voltage near the voltage design point because of actual chip manufacturing process variations. Binned voltage is a process of establishing just sufficient minimum voltage to meet the circuit performance criteria, and in the process minimizing power. Typical variation distribution may be +−5% around the design point (e.g. 1.05 to 0.95 for PCPU, and 0.8075 V and 0.89 V for ECPU.). FIG. 20A illustrates an SCVR efficiency plot for two circuit loads PCPU 304P and ECPU 304E connected to a single voltage input 107. Dot size represents energy usage at a performance state, with a larger dot representing the circuit load consuming the most energy. Also illustrated is a baseline efficiency level, above which is identified as an acceptable operating condition for the system. After binning, in the initial state illustrated in FIG. 20A, the largest energy consumer PCPU 304P is below the baseline efficiency level. The power management system in accordance with embodiments may allow adjustment of a number of parameters in accordance with embodiments, such as input voltage, output voltage, conversion ratios, and relative output voltages to the circuit loads (Vload). Adjustment of these parameters may also be dependent upon number of circuit loads, comparable energy usage of the circuit loads, and number of power supplies. By way of example, FIG. 20B illustrates one embodiment in which the issue in FIG. 20A may be remedied. In such an embodiment, the input voltage and conversion ratio mode may be adjusted to increase overall efficiency. As illustrated, the single voltage input 107 value is adjusted from a nominal value (V_in_nom) to a modified value (V_in_mod+). Suitably adjusting the input voltage and switched cap mode, the overall efficiency can be improved. Circuit load PCPU 304P can be connected to a first SCVR 120, with circuit load ECPU 304E is connected to a second SCVR 120, each SCVR 120 operating at a different conversion ratio mode. FIG. 20C shows another example. In this example, the ratio between PCPU and ECPU has increased, and is also inverted due to binning. In this case, the voltage input 107 value is decreased to a modified value (V_in_mod−) such that the higher energy usage block is at its peak. The curve can be shifted within legal input voltage, output voltage, and SCVR modes available.

Figure 21:
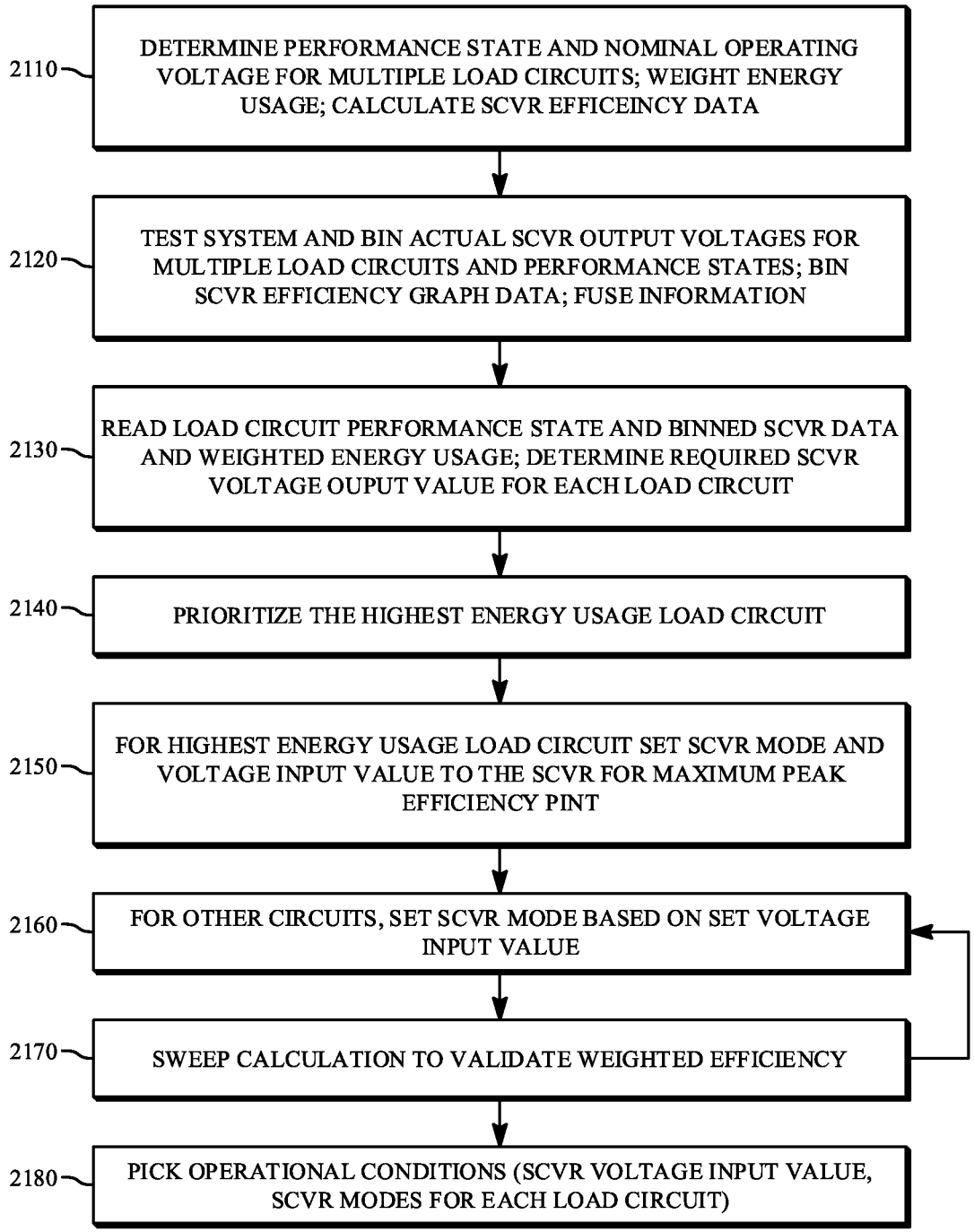
FIG. 21 is a flow chart of a method of fabricating a power management system including a single power supply and multiple circuit loads in accordance with an embodiment.

Generalizing, there may be more loads requiring optimization, than the number of options (SCVR modes, external VR number and settings). Therefore, an ensemble optimum efficiency has to be selected. Referring now to FIG. 21 a flow chart is provided that includes sequences for both design and test, as well as method of operation of a power management system including a single power supply and multiple circuit loads and corresponding SCVR in accordance with an embodiment. The sequence illustrated in FIG. 21 can relate to maintaining high efficiency for two (or more) circuit loads on the same chip, such as a CPU and GPU on the same chip. Thus, this may be a multiple load, single external voltage regulator, multiple SCVR case.

Block 2110 is directed to the initial architecture and design phase for the system, where performance states (e.g. high power, low power) of the circuit loads and nominal SCVR 120 voltage output 116 values to the circuit loads (Vload) are determined. In addition, energy usage for each circuit load is weighted, and SCVR efficiency plots are created. Block 2120 is directed to a manufacturing and test binning phase for the system. It is appreciated that the data collected is specific to the system, and each circuit load. Specifically, binned test data may include, for each performance state, actual SCVR 120 output voltages, SCVR 120 efficiency over a range of output voltages (e.g. such as data presented in FIG. 17), and for a range un input voltages. This information is then fused, for example to control 150.

The process sequence beginning at block 2130 may then be performed during actual use of the fabricated power management system 100 in accordance with embodiments. Thus, the sequence may be utilized for on the fly power management. At block 2130 control 150 may be used to read the multiple circuit load performance states, weighted energy use, and binned voltage information, which may be stored in a lookup table within control 150, and determine the required operating voltage (Vload) for each circuit load, which also corresponds to the SCVR 120 voltage output 116. At block 2140 the control 150 may assign a higher priority to the higher energy usage circuit load. At block 2150, for the highest energy usage circuit load, the control may first select the SCVR 120 conversion ratio mode and first level voltage regulator 110 output voltage value, which corresponds to the SCVR 120 voltage input 107 (Vin) values for the higher energy usage circuit load. At block 2160, with the first level voltage regulator 110 output voltage value already selected, the control 150 may select the SCVR 120 conversion ratio mode for the next highest energy usage circuit load, and so forth for multiple circuit loads. At block 2170 a weighted efficiency is calculated. A sweep through blocks 2150-2170 is performed to validate maximum weighted efficiency. At block 2180 the optimum efficiency point is selected (performance state for each circuit load, SCVR mode for each circuit load, and first level voltage regulator output voltage).

Figure 22A:
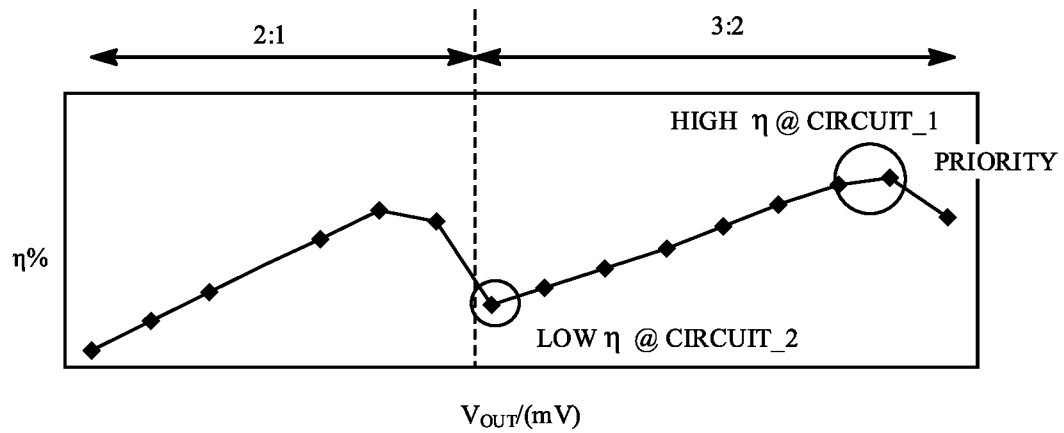
FIGS. 22A-22B are efficiency plots for an exemplary power management system including a single power supply and multiple circuit loads operated in accordance with the sequence illustrated in FIG. 21 in accordance with embodiments.
Figure 22B:
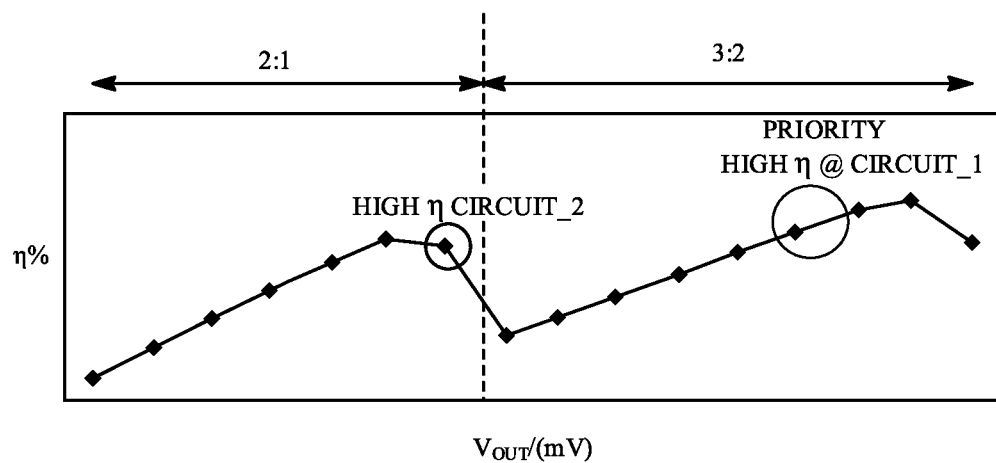

FIGS. 22A-22B are efficiency plots for an exemplary power management system including a single power supply and multiple circuit loads fabricated and operated in accordance with the sequence illustrated in FIG. 21. In the example provided in FIG. 22A, an efficiency plot corresponding to operation 2120 is provided for multiple, weighted circuit loads. For example, circuit 1 and circuit 2 may be different circuits (e.g. CPU, GPU) within a single chip 300. If nothing is done, then circuit 2 will operate at a poor efficiency. FIG. 22B relates to selection of the optimum (weighted) efficiency point from operation 2180. In this case, circuit 1 is the prioritized circuit of highest energy usage. As shown, the first level voltage regulator 110 output voltage, and corresponding SCVR 120 voltage input 107 (Vin) value, is adjusted while maintaining the SCVR for circuit 1 at a 3:2 conversion ratio mode, and changing the SCVR for circuit 2 to a 2:1 conversion ratio mode.

Figure 23A:
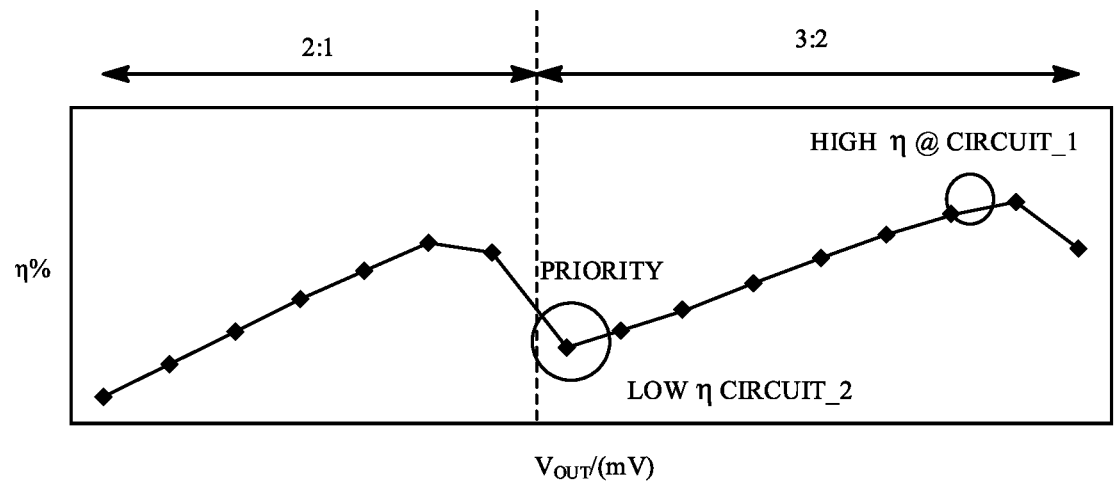
FIGS. 23A-23B are efficiency plots for an exemplary power management system including a single power supply and multiple circuit loads operated in accordance with the sequence illustrated in FIG. 21
Figure 23B:
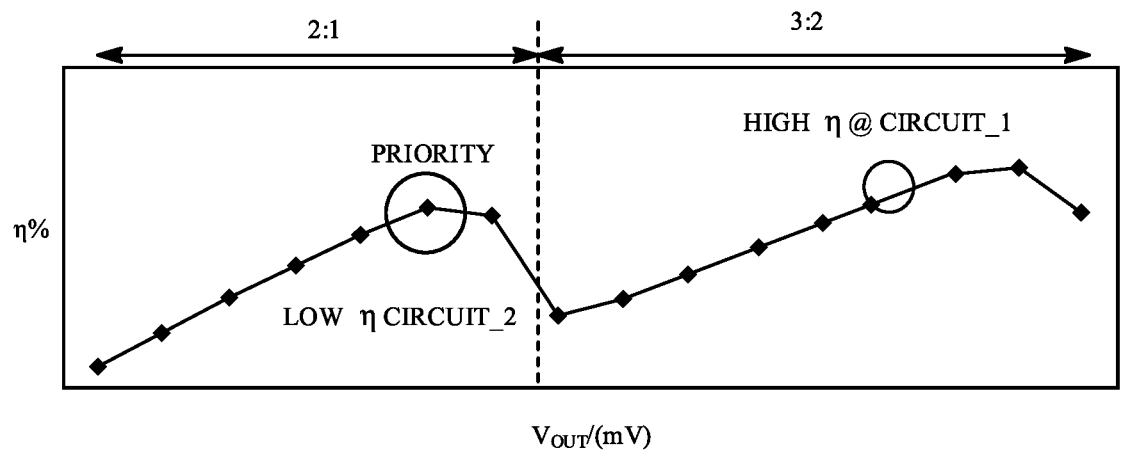

FIGS. 23A-23B are efficiency plots for an exemplary power management system including a single power supply and multiple circuit loads fabricated and operated in accordance with the sequence illustrated in FIG. 21. While only two circuit loads are illustrated, embodiments may include larger multiples of circuit loads. FIGS. 23A-23B are similar to FIGS. 22A-22B, with a difference being that circuit 2 is the prioritized circuit of highest energy usage. FIG. 23B relates to selection of the optimum (weighted) efficiency point from operation 2180. As shown, the first level voltage regulator 110 output voltage, and corresponding SCVR 120 voltage input 107 (Vin) value, is adjusted while changing the SCVR for circuit 2 to a 2:1 conversion ratio mode, and maintaining the SCVR for circuit 1 at a 3:2 conversion ratio mode. In this case, the first level voltage regulator 110 output voltage is adjusted to reach a maximum efficiency value of circuit 2, compared to the previous example of FIG. 22B in which the weighted efficiencies resulted in neither circuit load operating at the maximum efficiency of the corresponding SCVR. This can be generalized to multiple power rails corresponding to power states (high performance state, high wattage, high voltage; versus low performance state, lower wattage, lower voltage) as shown in FIG. 16. For each performance point of each circuit global optimization points are selected, corresponding to external voltage regulator voltages, SCVR modes. For example, in the embodiment illustrated in FIG. 23B, when circuit 1 and circuit 2 are both in high performance mode, power supply conductor 106 rail is selected for both circuit loads. Thus, power supply conductor 106 voltage is optimized, along with the respective SCVR modes to provide global efficiency optimization. Now if one of the circuit loads goes into a low performance mode, circuit 2 for example, while circuit 1 remains in high performance mode, then the PMU may select the auxiliary power supply conductor 106L and optimize the voltage and SCVR mode.

In utilizing the various aspects of the embodiments, it would become apparent to one skilled in the art that combinations or variations of the above embodiments are possible for designing and operating a power management system with a switched capacitor voltage regulator. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A power management system comprising:
    a main voltage source;
    an auxiliary voltage source;
    a circuit board including a main power supply conductor connected to the main voltage source, an auxiliary power supply conductor connected to the auxiliary voltage source, and a ground conductor;
    a circuit load located within a chip;
    a switched capacitor voltage regulator (SCVR) coupled to the main voltage source and the circuit load to receive an input voltage from the main voltage source and supply an output voltage to the circuit load;
    wherein the SCVR includes SCVR circuitry located within the chip and a discrete integrated passive device (IPD) connected to the chip;
    wherein the SCVR circuitry located within the chip includes a low power circuitry and a high power circuitry, the low power circuitry is coupled to the auxiliary power supply conductor and the ground conductor, and the high power circuitry is coupled to the main power supply conductor and the ground conductor; and
    wherein voltage outputs of the low power circuitry and the high power circuitry are electrically connected and engaged so as to provide a single voltage output rail to the circuit load to operate in high and low performance modes.

2. The power management system of claim 1, wherein the voltage source is a first level voltage regulator mounted on a circuit board.

3. The power management system of claim 1, wherein the discrete IPD includes a plurality of trench capacitors.

4. The power management system of claim 3, wherein the plurality of trench capacitors are formed in a resistive substrate.

5. The power management system of claim 4, wherein the IPD is bonded to the chip with a plurality of micro bumps.

6. The power management system of claim 5, wherein the IPD is laterally adjacent to a plurality of solder bumps connecting the chip to a circuit board.

7. The power management system of claim 5, further comprising a plurality of through silicon vias extending through the resistive substrate laterally adjacent to the plurality of trench capacitors.

8. The power management system of claim 4, wherein the IPD is embedded in an interposer layer between the chip and a circuit board.

9. The system of claim 8, further comprising a plurality of vias extending through the interposer layer.

10. The system of claim 4, wherein the IPD is hybrid bonded to the chip.

11. The system of claim 1:
further comprising a second circuit load located within the chip;
wherein the SCVR circuitry located within the chip includes a second low power circuitry and a second high power circuitry;
the second low power circuitry is coupled to the auxiliary power supply conductor and the ground conductor;
the second high power circuitry is coupled to the main power supply conductor and the ground conductor; and
wherein second voltage outputs of the second low power circuitry and the second high power circuitry are electrically connected and engaged so as to provide a single voltage output rail to the second circuit load to operate in high and low performance modes.

12. The system of claim 11:
further comprising a third circuit load located within the chip;
wherein the SCVR circuitry located within the chip includes a third high power circuitry;
the third high power circuitry is coupled to the main power supply conductor and the ground conductor; and
wherein a third voltage output of the third high power circuitry is to provide power to the third circuit load, wherein the third circuit load is not electrically connected to a low power circuitry of the SCVR circuitry located within the chip.

13. A power management system comprising:
a main voltage source;
an auxiliary voltage source;
a circuit board including a main power supply conductor connected to the main voltage source, an auxiliary power supply conductor connected to the auxiliary voltage source, and a ground conductor;
a circuit load located within a chip;
a switched capacitor voltage regulator (SCVR) coupled to the main voltage source and the circuit load to receive an input voltage from the main voltage source and supply an output voltage to the circuit load;
wherein the SCVR includes SCVR circuitry located within the chip and a discrete integrated passive device (IPD) connected to the chip;
wherein the SCVR circuitry located within the chip is coupled to the auxiliary power supply conductor and the ground conductor, and a voltage output of the SCVR circuitry located within the chip is electrically connected to the main power supply conductor and the circuit load.

14. The power management system of claim 13, wherein the voltage source is a first level voltage regulator mounted on a circuit board.

15. The power management system of claim 13, wherein the discrete IPD includes a plurality of trench capacitors.

16. The power management system of claim 15, wherein the plurality of trench capacitors are formed in a resistive substrate.

17. The power management system of claim 16, wherein the IPD is bonded to the chip with a plurality of micro bumps.

18. The power management system of claim 17, wherein the IPD is laterally adjacent to a plurality of solder bumps connecting the chip to a circuit board.

19. The power management system of claim 17, further comprising a plurality of through silicon vias extending through the resistive substrate laterally adjacent to the plurality of trench capacitors.

20. The power management system of claim 16, wherein the IPD is embedded in an interposer layer between the chip and a circuit board.

21. The system of claim 20, further comprising a plurality of vias extending through the interposer layer.

22. The system of claim 16, wherein the IPD is hybrid bonded to the chip.

* * * * *

UNITED STATES PATENT AND TRADEMARK OFFICE
CERTIFICATE OF CORRECTION

PATENT NO. : 10,756,622 B2
APPLICATION NO. : 16/231904
DATED : August 25, 2020
INVENTOR(S) : Sanjay Dabral et al.

Page 1 of 1

It is certified that error appears in the above-identified patent and that said Letters Patent is hereby corrected as shown below:

In the Specification

Column 11,
Lines 17 to 18, delete "load circuit 140" and insert in place there of --circuit load 140--.

Column 14,
Line 37, delete "voltage output 107" and insert in place there of --voltage output 116--.

In the Claims

Column 18,
Line 48, Claim 2, delete "a circuit board" and insert in place there of --the circuit board--.

Column 18,
Line 58, Claim 6, delete "a circuit board" and insert in place there of --the circuit board--.

Column 18,
Line 65, Claim 8, delete "a circuit board" and insert in place there of --the circuit board--.

Column 20,
Line 15, Claim 14, delete "a circuit board" and insert in place there of --the circuit board--.

Column 20,
Line 26, Claim 18, delete "a circuit board" and insert in place there of --the circuit board--.

Column 20,
Line 33, Claim 20, delete "a circuit board" and insert in place there of --the circuit board--.

Signed and Sealed this
Twenty-fourth Day of November, 2020

Andrei Iancu
*Director of the United States Patent and Trademark Office*